US007672783B2

(12) United States Patent
Oettinger

(10) Patent No.: US 7,672,783 B2
(45) Date of Patent: Mar. 2, 2010

(54) SYSTEM AND METHOD FOR RECORDING, TRANSMITTING AND ANALYZING DATA AND INFORMATION ACCRUED FROM ELECTROMAGNETIC RADIATION

(75) Inventor: Wolf Peter Oettinger, Munich (DE)

(73) Assignee: Nowcast Mobile GmbH (DE)

( * ) Notice: Subject to any disclaimer, the term of this patent is extended or adjusted under 35 U.S.C. 154(b) by 703 days.

(21) Appl. No.: 10/587,190

(22) PCT Filed: Jan. 27, 2005

(86) PCT No.: PCT/EP2005/050355

§ 371 (c)(1),
(2), (4) Date: Sep. 5, 2006

(87) PCT Pub. No.: WO2005/073752

PCT Pub. Date: Aug. 11, 2005

(65) Prior Publication Data

US 2007/0156339 A1     Jul. 5, 2007

(30) Foreign Application Priority Data

Jan. 29, 2004 (DE) .................. 10 2004 004 580
Feb. 9, 2004  (DE) .................. 10 2004 006 253
Jul. 9, 2004   (DE) .................. 10 2004 033 386
Aug. 18, 2004 (DE) .................. 10 2004 000 025

(51) Int. Cl.
G06F 19/00 (2006.01)
G01W 1/00 (2006.01)
(52) U.S. Cl. ...................................... 702/4; 73/170.24
(58) Field of Classification Search ............... 702/1–4, 702/97, 127, 150, 151, 159; 342/26 B, 26 D, 342/460; 324/72, 457; 73/170.24, 170.16, 73/170.27
See application file for complete search history.

(56) References Cited

U.S. PATENT DOCUMENTS

| 3,369,240 | A | * | 2/1968 | Leary ...................... 342/460 |
| 5,036,334 | A | * | 7/1991 | Henderson et al. .......... 342/460 |
| 5,235,341 | A | * | 8/1993 | Effland et al. ............. 342/460 |
| 6,246,367 | B1 | | 6/2001 | Markson et al. ............ 342/460 |
| 6,735,525 | B1 | | 5/2004 | Murphy ..................... 702/4 |
| 6,768,946 | B2 | * | 7/2004 | Okabe et al. ................ 702/4 |
| 6,868,339 | B2 | * | 3/2005 | Murphy et al. .............. 702/4 |

FOREIGN PATENT DOCUMENTS

DE  41 33 209     4/1993
DE  198 26 122    2/1999

OTHER PUBLICATIONS

Laszlo et al., Lightning Detecting and Locating System: Technical and Economical Aspects Regarding Its Introduction to the IEC Power System, Mar. 5-7, 1991, 17th Convention of Electrical and electronics Engineers in Israel, pp. 334-337.*

(Continued)

Primary Examiner—Michael P. Nghiem
Assistant Examiner—Toan M Le
(74) Attorney, Agent, or Firm—Nields, Lemack & Frame, LLC

(57) ABSTRACT

A system and a method for recording, transmitting and analyzing data and information accrued from, low-frequency, electromagnetic radiation, where the electromagnetic radiation originates from at least one impulse source of natural and/or artificial origin, from at least one atmospheric discharge or from at least one transmitter, a precise characterization of the impulse source, a reliable differentiation between cloud-ground lightning and cloud-cloud lightning within a cloud or between clouds is provided for, including localize the altitude of the impulse source, the emission altitude or the broadcast altitude, and/or the directionality, the spatial direction path of the impulse emission or impulse broadcast caused by the impulse, by determining the difference between the arrival time of the signal at the measuring station located closest to the impulse source and the arrival time of the signal at at least one, preferably two, measuring stations which are not located closest to the impulse source.

17 Claims, 10 Drawing Sheets

OTHER PUBLICATIONS

H.-D. Betz, et al.; "Total VLF/LF-Lightning and Pseudo 3D-Discrimination of Intra-Cloud and Cloud-to-Ground Discharges"; 18$^{th}$ International Lightning Detection Conference; Jun. 7, 2004; XP002326501; Ref. 33 ILDC 2004.

International Search Report dated May 2005.

Kawasaki, Z.-I. et al. 91994), "SAFIR operation and evaluation of its performance", Geophys. Res. Lett. 21 (12), pp. 1133 to 1136, Jun. 15, 1994.

Thery, C. (2001), "Evaluation of LPATS data using VHF interferometric observations of lightning flashes during the EULINOX experiment", Atmospheric research 56, pp. 397 to 409.

Jacobson et al. (2000), "FORTE radio-frequency observations of lightning strokes detected by the National Lightning Detection Network", J. Geophys. Res. 105, pp. 15653 to 15662.

Smith et al. (1999), "A distinct class of isolated intracloud lightning discharges and their associated radio emissions", J. Geophys. Res. 104, pp. 4189 to 4212.

Krehbiel et al. (1999), "Three-dimensional lightning mapping observations during MEAPRS in central Oklahoma", 11$^{th}$ Int. conf. On Atmosph. Electricity, NASA/CP, Alabama, Jun. 1999, pp. 376 to 379.

Taylor (1978), "A VHF technique for space-time mapping of lightning discharge processes", J. Geophys. Res. 83, pp. 3575 to 3583.

Richard and Auffray (1985), VHF-UHF interferometric measurements, applications to lightning discharge mapping;, Radio science 20, pp. 171 to 192.

Rhodes et al. (1994), "Observations of lightning phenomena using radio interferometry", J. Geophys. Res. 99, pp. 13059 to 13082.

Laroche et al. (1996), "3D structure of lightning discharge within storms", 10$^{th}$ Int. Conf. Atmosph. Electricity, Osaka, Jun. 10, 1996 to Jun. 14, 1996, pp. 330 to 332.

Onuki et al. (1996), "Imaging of lightning channel in three dimensions using interferometer", 10$^{th}$ Int. Conf. Atmosph. Electricity, Osaka, Jun. 10, 1996 to Jun. 14, 1996, pp. 325 to 328.

Richard and Lojou (1996), "Assessment of application of storm cell electrical activity monifotri8ng to intense precipitation forecast", 10$^{th}$ Int. conf. Atmosph. Electricity, Osaka, Jun. 10, 1996 to Jun. 14, 1996, pp. 284-287.

Orville, R.E. et al. (2002), "The North American Lightning detection Network (NLDN)-First results: 1998-2000", Monthly Weather Review 130 (8), pp. 2098-2109.

Diendorfer, et al. 91994), "Results of a performance analysis of the Austrian Lightning Location Network ALDIS", 22$^{nd}$ Int. Conf. On Lightning Protection, Sep. 19-23, Budapest, Hungary, 1994.

Defer, E. et al. (2000), "Simultaneous observations of CG activity from NALDN and ONERA-ITF interferometric mapper during the STERAO-A experiment", Int. Lightning Detection Conf., Nov. 7-8, Tucson, Arizona (Global Atmospherics Inc.), Jan. 13, 2009.

Schulz W et al.: "Site-Error-Korrektur bei einem Blitzortungssystem mit magnetic-Direction-Findern"; 8038 E&I Elektrotechnik und Informationstechnik vol. 110, No. 5, Jan. 1993 pp. 239-248, XP000361391.

Diendorfer G et al.; "ALDIS-das Osterreichische Blitzortungssystem" 8038 E&I Elektrotechnik Und Informationstechnik, Springer Verlag, Wien, AT, vol. 109, No. 5, Jan. 1992, pp. 261-266; XP000304331.

* cited by examiner

SYSTEM AND METHOD FOR RECORDING, TRANSMITTING AND ANALYZING DATA AND INFORMATION ACCRUED FROM ELECTROMAGNETIC RADIATION

TECHNICAL FIELD

The present invention relates to a system and a method for recording, transmitting and analyzing data and information accrued from electromagnetic radiation.

PRIOR ART

Lightning localization systems have been used worldwide for over ten years, enabling ground lightning strokes to be localized with an increasing degree of precision, which with modern networks lies within a range of below one kilometer. The degree of detection efficiency is usually over ninety percent for lightning strokes with a strength of over five kiloamperes; with weaker lightning strokes, however, no reliable statistical data is known.

Traditionally, the operational networks are designed in such a way that predominantly ground lightning strokes (=CG or Cloud-Ground) are reported, and cloud-cloud lightning strokes (=I[ntra]C[loud] within a storm cloud, or C[loud-]C[loud] between storm clouds) are repressed as far as is possible. Recently, however, the trend has increasingly been to also record discharges within the clouds for meteorological purposes.

A differentiation between CG lightning strokes and IC-/CC lightning strokes is possible with special procedures, in particular with three-dimensional methods (so-called 3D methods), whereby measurements in the V[ery]H[igh]F[requency] range and in the V[ery]L[ow]F[requency] range can be combined with each other [cf. Kawasaki, Z.-l. et al. (1994), "SAFIR operation and evaluation of its performance", Geophys. Res. Lett. 21(12), pages 1133 to 1166; Thery, C. (2001), "Evaluation of LPATS data using VHF interferometric observations of lightning strokes during the EULINOX experiment", Atmospheric research 56, pages 397 to 409].

In the essay by Jacobson et al. (2000), "FORTE radio-frequency observations of lightning strokes detected by the National Lightning Detection Network", J. Geophys. Res. 105, pages 15653 to 15662, a three-dimensional method is described, for example, in which three-dimensional mapping is initially completed using VHF radio frequencies, and then a search is conducted via the time coincidence for the corresponding VLF signal from an existing two-dimensional VLF network (so-called NLDN).

Furthermore, Smith et al. (1999) in their essay "A distinct class of isolated intracloud lightning discharges and their associated radio emissions", J. Geophys. Res. 104, pages 4189 to 4212, describe a three-dimensional method which entails pure VHF mapping, however, without any relation to the VLF.

A three-dimensional method with a good definition of discharge channels is described by Krehbiel et al. (1999) in the publication "Three-dimensional lightning mapping observations during MEAPRS in central Oklahoma", 11th Int. Conf. on Atmosph. Electricity, NASA/CP, Alabama, June 1999, pages 376 to 379. However, this method comprises no relation to the VLF, and is based purely on the VHF mapping in the clouds.

Already at a very early stage, in the document by Taylor (1978), "A VHF technique for space-time mapping of lightning discharge processes", J. Geophys. Res. 83, pages 3575 to 3583, the possibility of direct spatial mapping of high emission types using run time measurements was described.

In this known method, two closely adjacent stations are used, each of which requires two sensors in a vertical arrangement (including a sensor close to the ground and a sensor at a height of approximately fifteen meters) to measure run time differences in the nanosecond range, and thus to determine the angle of elevation, the intersecting point of which gives the emission type using triangulation.

Further dimensional methods are described in the following documents:

Richard and Auffray (1985), "VHF-UHF interferometric measurements, applications to lightning discharge mapping", Radio Science 20, pages 171 to 192;

Rhodes et al. (1994), "Observations of lightning phenomena using radio interferometry", J. Geophys. Res. 99, pages 13059 to 13082;

Laroche et al. (1996), "3D structure of lightning discharge within storms", 10th Int. Conf. Atmosph. Electricity, Osaka, 10 Jun. 1996 to 14 Jun. 1996, pages 330 to 332;

Onuki et al. (1996), "Imaging of lightning channel in three dimensions using interferometer", 10th Int. Conf. Atmosph. Electricity, Osaka, 10 Jun. 1996 to 14 June 1996, pages 325 to 332; and Richard and Lojou (1996), "Assessment of application of storm cell electrical activity monitoring to intense precipitation forecast", 10th Int. Conf. Atmosph. Electricity, Osaka, 10 June 1996 to 14 Jun. 1996, pages 284 to 287.

The localization methods used worldwide over large areas are however based on a small number of complex, two-dimensional systems (so-called 2D systems), with which it is more difficult to differentiate between CG lightning versus IC/CC lightning. Some manufacturers report reliable differentiation methods which are dependent on the impulse form; however, overall, the literature regarding this issue is extremely contradictory.

DISCLOSURE OF THE INVENTION

Object, Solution, Advantages

Starting from the disadvantages and shortcomings as described above and taking the prior art as described into account, the object of the present invention is to further develop a system of the type named in the introduction as well as a method of the type named in the introduction, so that a precise characterization of the impulse source, for example a reliable differentiation between cloud-ground lightning (C[loud]G[round]) and cloud-cloud lightning (=I[ntra]C[loud] within a cloud, or C[loud-]C[loud] between clouds) is provided for.

According to the teaching of the present invention, this object is attained by a system with the features in claim 1 as well as by a method with the features in claim 11. Advantageous embodiments and expedient further developments of the present invention are disclosed in the respective dependent claims.

The core of the present invention lies in the three-dimensional mapping of impulse emissions/broadcasts of natural and/or non-natural origin, in particular of lightning strokes, discharge releases, charge broadcasts or similar in V[ery]L[ow]F[requency] networks; in particular, the use of frequencies in the radio or the V[ery]H[igh]F[requency] range is not required.

In order to differentiate it from conventional mapping methods which are already known, it applies in the present invention that the mapping is conducted not only in a direct manner with one or two of the sensors which are close to the impulse source, in particular to the source of the lightning, i.e. it is not only conducted using upwards mapping close to the location, but through the use of deviations in the signal receiving times at the sensor stations which are respectively closest to the impulse source, in particular closest to the lightning, in contrast to other sensor stations which are not closest to the impulse source, in particular not closest to the lightning.

As a result, the present invention is concerned with a newly designed impulse localization system, in particular lightning localization system, which in principle is initially based on the proven, two-dimensional method (so-called 2D lightning mapping) in the V[ery]L[ow]F[requency] range.

Here, it should be noted that in numerous countries, 2D lightning localization systems are in operation. These include the North American NALDN network in the USA [cf. Orville, R. E. et al. (2002), "The North American Lightning Detection Network (NALDN)—First results: 1998-2000", Monthly Weather Review 130 (8), pages 2098 to 2109], and the European combined EUCLID system.

This EUCLID system was created from a combination of the federal German BLIDS system operated by Siemens (with US sensor technology and network software) and the Austrian ALDIS network [cf. Diendorfer, G. et al. (1994), "Results of a performance analysis of the Austrian Lightning Location Network ALDIS". In: 22nd Int. Conf. on Lightning Protection, Sept. 19-23, Budapest, Hungary] and its extension to numerous other neighboring countries.

These networks operated in the VLF range and use the classic direction mapping procedures (so-called D[irection] F[inding]) and/or the signal run times (T[ime]O[f]A[rrival]). The VLF radiation emitted from an impulse source, in particular from a lightning stroke, can be received at several sensor stations if its level is sufficiently high. In order to determine the location source, the incident directions (DF) and/or the run time differences (TOA) measured at the individual stations can be used.

If the signals are now detected on only two sensors, the directions provide a mapping location which can be optimized by incorporating the signal times. When recording the signals on more than two stations, the T[ime]O[f]A[rrival] procedure is to be preferred for reasons of precision, since precisions which are relatively easy to achieve of approximately one microsecond already lead to localizations which are better than one kilometer.

Accordingly, in the schematic illustration of the basic principle shown in FIG. 5, the decisive run time delay $dT=T_P-T_H$ which is conditional upon I[ntra]C[loud] discharges (in contrast to C[loud]G[round] lightning) is shown.

The arrangement of the signal treatment and impulse processing is therefore advantageously designed in such a manner that significantly higher degrees of time precision (better than one microsecond, i.e. less than one microsecond) can be achieved than with conventional systems. This precision is of importance in order to determine the event locations of impulses, in particular of lightning strokes, using the run time procedure.

With the analysis method advantageously used, a precise time determination is possible even with irregular impulse forms (better than one microsecond, i.e. less than one microsecond), in particular for signals which are recorded at different sensors and which belong to the same impulse event, in particular to the same lightning event. This can be achieved in a manner according to the invention by sample and form recognition algorithms, for example.

In the central unit of the network, for example, special algorithms are therefore used, in particular algorithmic sample detection, to seek out those among the numerous signals received from the individual sensors which belong to the same impulse event.

For this purpose, the peak samples received from the different individual sensors are "placed one on top of the other" in a digitalized form, in order to be able to clearly identify the initial peak in this manner. This "matching" procedure enables a good mapping result with a precise time to be achieved, which in turn is important for the height mapping. As a result, the high degree of event sensitivity can be achieved, and the resulting high number of primarily recordable signals can in fact be further used, and can also be usefully employed with regard to the signal properties.

The filtering out of signals which belong to the same lightning event is not trivial with high levels of data, since time overlaps occur. However, if a signal group contains an incorrect signal, the lightning cannot successfully be located. This problem is not solved in conventional systems; this is also reflected in the fact that conventional lightning localization systems report very strong lightning strokes several times on the one hand, since the individual signals on the sensors are not correctly grouped, and on the other hand, weak signals are not recognized as belonging together due to the non-identical impulse forms.

Furthermore, with conventional lightning localization systems, erroneous mapping with significant location deviations may occur.

If more than three items of measuring data are available, the three unknown sizes to be determined (=the length; the width; the impulse emission time, in particular the lightning time) can be calculated using the standard minimalization method. Insofar as systematic errors also remain in the order of approximately one microsecond, the aforementioned mapping accuracy can also be achieved in the long term in continuous practical operation, and can be verified on the basis of impacts in measuring towers, for example.

Since the system according to the present invention, together with the method according to the present invention achieves a particularly high level of detection efficiency, even with weak impulses, in particular with weak lightning strokes, and no measures to suppress IC discharges, in particular IC lightning strokes need to be applied, the new network delivers significantly more discharge events than conventional comparative systems. For this reason, the issue of the origin of the discharges becomes particularly important.

For this purpose, the network is extended according to the method of the present invention by a three-dimensional mode (a so-called 3D mode), so that emission levels of impulses, in particular of discharges, can be determined. In this way, according to the invention, a decisive, new type of contribution is recommended for identifying IC/CC discharges, in particular IC/CC lightning strokes.

A method of this type offers a series of technical and economic advantages:

since only one station needs to be close to the impulse source, in particular to the source of the lightning, large sensor distances are possible, i.e. no compact, expensive network is required;

due to the use of G[lobal]P[ositioning]S[ystem]-controlled time measurements, even greater distances of up to approximately one hundred kilometers to the lightning station are valid as being "close to the impulse source", or "close to the lightning source", and produce significant time deviations, i.e. those which can be used for the height mapping;

the use of V[ery]L[ow]F[requency] measuring networks (=in the range of ten Kilohertz) secures a very large range for the measuring stations which are not positioned closest to the impulse source, such as the lightning stations which are not positioned closest to the lightning (which are still required to record the lightning), i.e. established VLF networks can be used, insofar as the time measurements are precise in the microsecond range;

the system according to the present invention, together with the method according to the present invention, can be used on the basis of the hardware of standard 2D lightning localization methods; the use of "real" 3D technologies in the radio or VHF range is not required insofar as the aim of the present invention is not the precise spatial definition of discharge channels, such as lightning channels, in the 100-meter range, but to provide a data basis for a decision with regard to the issue of whether the detected event is to be classified as an I[ntra]C[loud] impulse, in particular as an I[ntra]C[loud] event;

the existence of impulse emissions or impulse broadcasts, in particular of lightning emissions from heights measured in kilometers, can be detected without requiring theory and without the assumption of adjustable parameters from a comparison of the distributions of time deviations measured on individual sensors (respectively closest to the lightning) and on groups of sensors (not closest to the lightning) from two impulse emission times (the impulse time determined in the network by the total mapping minus the difference between the arrival time and the run time on the station respectively positioned closest to the impulse source), in particular of two lightning times (the lightning time determined in the network by the total mapping minus the difference between the arrival time and the run time on the station respectively positioned closest to the lightning);

the level of emission can be calculated using algorithms which can at least be compared with those of the location mapping by adding the height variables;

the method can be integrated into other existing impulse localization systems, in particular lightning localization systems, insofar as the necessary time precision is achieved;

the method can also be used with low-intensity impulses, in particular with low-intensity lightning strokes, insofar as the impulse, in particular the lightning, is measured on three, and when incidence directions are used for mapping purposes, also on only two sensors;

the results of the method can be used to explain issues relating to the impulse form discrimination of cloud-cloud discharges (IC), in particular of cloud-cloud lightning, as opposed to cloud-ground discharges (CG), in particular cloud-ground lightning; and the system according to the present invention, together with the method according to the present invention, can be used with the impulse form analysis for discrimination purposes, in order to resolve the (small) percentage in disputed cases which cannot be clearly decided either with the one method or with the other method.

With an advantageous embodiment of the present invention, the sensor operates passively and without a power supply. This reduces sources of error, in contrast to known systems. In addition, the sensor, when it operates passively and without a power supply, can process significantly higher data rates than has been the case with the systems described earlier or with existing prior art systems.

Alongside the technical and economical advantages explained above, the present invention also offers a series of application advantages, such as important meteorological knowledge and knowledge of cloud physics regarding the occurrence of IC lightning strokes, an extremely reliable differentiation between CG lightning strokes versus IC lightning strokes, improved identification of CG lightning strokes, which leads to important subsequent data in the form of more reliable lightning density maps (improvement in lightning protection, which is of interest to the car industry, the construction industry, event organizers, travel agents and/or the insurance industry, for example), or the recording of a significantly higher number of lightning strokes than are reported by standard networks, which in connection with CD identifications leads to significantly higher ground lightning densities than have been assumed to date.

Furthermore, the present invention provides a contribution towards solving a series of problems, such as the necessity for precise time determination, even with low-intensity, noise contaminated, complex formed and/or overcontrolled signals, in order to guarantee the greatest possible quantitative recording and differentiation of impulses (I[ntra]C[loud] versus C[loud-]G[round]), in particular of lightning strokes, the necessity for the efficient detection of non-impulse-correlated, in particular of non-lightning-correlated interference signals, the necessity for an optimum arrangement with regard to the time management of all station and network components, or the necessity of using complex algorithms for the most reliable possible impulse emission differentiation, in particular discharge differentiation, of real and statistical altitude mapping, and altitude mapping which is conditional upon systematic errors.

The necessity for determining the time therefore entails, according to an advantageous further development of the present invention, a particularly precise time identification of the signals arriving on the individual sensors. This time identification is conducted in the most uniform manner possible on the different sensor stations for signals from the same impulse, in particular from the same lightning stroke.

Due to this precise time identification, the identification times can be used to determine whether on a sensor which is close to the impulse source, in particular on a sensor which is close to the lightning—relative to the other sensors—a delayed signal time is measured; if a delay of this nature of the signal time is present, this indicates an extended running distance, and thus that the signal originates from a greater altitude.

Since this runtime difference to be utilized becomes ever smaller as the distance increases between the location of the impulse source, in particular the location of the lightning, and the sensor in question, the efficient altitude mapping requires the measurement and use of very small time differences of maximum approximately one microsecond. With an advantageous embodiment of the invention, therefore, the identifications of the individual signals are no less precise than this time difference.

In addition, the present invention makes it possible to discuss new issues relating to the VLF emission from storm clouds. It is thus an essential aspect of the invention that in order to map the altitude, the delay in the impulse arrival time, in particular the lightning arrival time, is caused by the longer run time to the emission source, and not by apparative or other systematic errors. In the following, the five most important possible effects will be discussed, which may influence the altitude determination:

(i) Initially, it could be assumed that delayed arrival times caused by system errors are distributed in purely statistical terms, and have not physical significance. Since the delays in question usually last for several microseconds, depending on the distance to the impulse source, in particular to the lightning, relatively large time errors must be assumed which must be eliminated due to the demonstrably precise mappings.

Furthermore, one would then expect that errors with lower delay times would occur more frequently, and that the resulting altitude distribution against the actual results for low altitudes of the impulse source, in particular for low lightning altitudes, would strongly increase close to zero.

A study of the time distances between the established impulse emission or impulse broadcast time, in particular the established lightning time, and the resulting impulse emission or impulse broadcast times, in particular the lightning times, which result from the individual stations in accordance with the arrival time and the running time to the location of the impulse source, in particular to the location of the lightning, result according to the invention in no systematic deviations of the times reported from a station relative to the stations overall.

(ii) Signal delays on one sensor station can be created by electronic effects, and the different stations can have different strengths on the different stations.

Were this to be the case, the 3D mapping would in almost all cases lead to fictitious, station-related, different impulse source altitudes, in particular lightning altitudes, and not only with a fraction of the signal groups. In addition, this error would have to be detected in the test according to item (i) above.

(iii) Incorrect arrival times can be caused by the erroneous evaluation of the signals received; in particular with impulses with several significant extreme values, or with non-disintegrated double peak structures, an incorrect time identification may result.

With peaks which have not yet disintegrated, an error of this type would however usually lead to the opposite effect (--> too early arrival time instead of too late arrival time), since the station closest to the impulse, in particular closest to the lightning, receives the strongest signal, and it can therefore hardly be anticipated that the first relevant signal peak is suppressed, and instead, the second ("delayed") peak is recorded for the time identification.

With double structures which have been poorly disintegrated, however, at the station which is closest to the impulse, in particular closest to the lightning, the maximum may lie in the part which comes later in time, while with stations which are further away, the structure is no longer disintegrated due to damping and dispersion effects, and an earlier maximum is found in the middle of the overall peak. The signal evaluation according to the present invention takes into account and solves problems of this nature.

(iv) In particular with close impulse sources, in particular with close lightning strokes, the sensors can overcontrol and therefore report falsified time identifications and incidence directions, or none at all.

It is frequently reported with existing localization networks that in order to avoid such complications, stations close to the impulse source, in particular stations close to the lightning source, are not taken into account. For 3D mapping, the most interesting information would then be lost.

The receiving stations according to the present invention are therefore designed for a high intensity resolution with a large dynamic range—without becoming insenstivie to the weakest signals—and the impulse treatment can also reliably process sated signals. This is made easier by the fact that the field B(t) and not the deflection dB/dt is measured, so that integration procedures are no longer required.

(v) It is well known that local "site errors" lead to the falsification of the measured incidence directions; the related time errors have been less frequently reported.

Should these time errors exceed a range of approximately one microsecond, which appears to be wholly conceivable, errors would occur in the 2D localization of the network which may not automatically be grave, but which would result in fictitious emission altitudes in the three-dimensional localization. An effect of this nature would then occur with nearly all signals, and would be identifiable as a result (cf. item (i) above).

Taking into account the above findings, it can be assumed with the present invention that the 3D mappings presented here indicate real runtime delays which are created by emission in the storm clouds rather than close to the ground.

The altitudes of the impulse sources, in particular the altitudes of the lightning, determined according to the invention are also compatible with the geometry of typical storm clouds. Since it is generally assumed, and for good reasons, that CG discharges, in particular CG lightning strokes, which are close to the ground generate the main radiation in the VLF range, the conclusion is self-evident that the 3D mappings relate to negative and positive IC discharges, in particular IC lightning strokes, which comprise a strong vertical discharge direction.

More horizontal IC or CC discharges, such as IC or CC lightning strokes, can hardly be received on several stations with amplitudes according to a 1/R dependence, due to the radiation characteristics which are more disadvantageous for the measuring technique applied according to the invention.

The present invention also includes, specifically for line-shaped impulse sources, the option of separating impulse sources, for example IC (or CC) lightning strokes, into vertical and horizontal discharge channels, in particular lightning channels, i.e. it includes the option of discriminating between IC (or CC) discharges, in particular between IC (or CC) lightning strokes, which as a rule run vertically or horizontally.

This is achieved according to the invention by the fact that the measured amplitudes A on a sufficient number of sensor stations are tested with regard to their distance R:

If the distance-dependent amplitude A(R) is compatible with a 1/R law, and if the impulse event, in particular the lightning event, has been classified using the 3D procedure as an I[ntra]C[loud] or I[nter]C[loud] type, the lightning is predominantly vertical.

However, if strong deviations can be detected from the 1/R law, and if they can be corrected by the radiation characteristic being taken into account according to two angles, such as the altitude angle and the angle between the impulse emission/broadcast axis, in particular the lightning axis, and the direction to the sensor, the discharge channel, in particular the lightning channel, is predominantly horizontal.

The amplitudes A(R) which are dependent on the distance can be dampened by variable ground conductivity, which may interrupt a 1/R dependence. In the present invention, this circumstance is taken into account due to the fact that groups of impulse sources, such as lightning strokes, from close spatial ranges are analyzed together according to a preferred further development of the present system, as well as of the present method. With this optional technical measure, it can be determined whether the dampening effects with the same or a very similar running distance are constant, or whether they only occur with individual (horizontal) impulses, in particular lightning strokes.

This group analysis can if necessary even be conducted online, for example when the storm in question delivers sufficient lightning strokes from the same region within the selected reporting period for three-dimensional impulse localizations, in particular lightning localizations (for example, of one minute). Otherwise, this additional information can in all cases be determined offline via horizontal impulses, in particular via horizontal lightning strokes, i.e. using subsequent analysis.

Another interesting issue in connection with the present invention is the extent to which ground-cloud discharges (G[round-]C[loud]) which are directed upwards, such as ground-cloud lightning strokes, radiate on the lower boundary of the cloud. In this respect, it is useful to check examples of the findings obtained according to the invention using real 3D systems [cf. Defer, E. et al. (2000), "Simultaneous observations of CG activity from NALDN and ONERA-ITF interferometric mapper during the STERAO-A experiment". In: Int. Lightning Detection Conf., Nov. 7-8, Tucson, Ariz. (Global Atmospherics Inc.)].

A refinement of the present invention, the pseudo 3D system or the pseudo 3D procdedure for determining the altitudes of impulse sources such as lightning emission altitudes in the VLF range in terms of even more precise time resolutions than are realized during the first phase of the network, and the combination with impulse form analyses, enable with a minimum level of additional effort a more reliable and almost quantitative (online) discrimination of CG impulses, in particular of CG lightning strokes, and IC impulses, in particular IC lightning strokes.

In principle, the utilization of the 2D lightning localization network as a pseudo 3D network using the method according to the present invention enables the identification of discharges which are emitted in storm clouds from a great altitude.

With an advantageous embodiment of the present invention, the sensor actually measures the magnetic induction B(t) directly as a function of the time. Here—as is physically compulsorily specified—the induction law is used. The utilization of the induction law leads with the conventional application to a measured voltage which is proportional to the deflection dB/dt of the magnetic induction B(t) according to the time t.

A useful embodiment of the present invention contains an electrical circuit, however, which in the selected frequency range actually does lead to B(t). An important side effect is that as a result, no subsequent elements are required in order to integrate dB/dt to B(t) (if they were to be necessary, subsequent elements of this type would in turn lead to additional imprecisions, since integration would also have been completed via the unavoidable noise elements). According to the invention, the system is also designed in such a manner that simultaneously an extremely high signal sensitivity is created.

A requirement for the application of the system and the method according to the present invention is a precise determination of the signal arrival times on the individual sensor stations down to approximately one microsecond, even with complex impulse forms, in particular with lightning impulse forms, which can be achieved when the GPS receivers are used optimally and when the impulses are intelligently analyzed.

It is therefore possible according to the invention to subject a large number of the impulses which can be mapped in a localization network, in particular lightning strokes, and in networks with lower station distances even the majority of all impulses, in particular lightning strokes, to a 3D analysis, and to determine very directly—without any theoretical assumptions and without any adjustable parameters—whether the emission was made close to the ground.

This achieves a significant contribution to a comprehensible, reliable identification of CG impulses, in particular of CG lightning strokes, even in spatially large networks, without requiring any significant additional effort. The advantages of "real" 3D systems remain entirely unaffected, since these are aimed at achieving more fundamental physical processes and discharge channel resolutions which cover a smaller area, such as lightning channel resolutions, than the pure lightning localization treated here.

As already shown in the description of the present invention in the introduction, the localization of impulse sources, in particular the localization of lightning, can be conducted using V[ery]L[ow]F[requency] measurements either with the direction mapping procedure (so-called "D[irection]F[inding]") and/or the runtime differentiation method (the so-called "T[ime]O[f]A[rrival] method").

With the traditional directional mapping (DF =direction finding), the incidence direction of the electromagnetic radiation, in particular the incidence direction of the lightning signal, is measured on the sensor stations, and the impulse source is localized using point of intersection procedures, in particular the location of the lightning is determined. With this conventional procedure, imprecisions occur, which are identified as a local error, or "site error".

In the past, methods have been published with the aim of subsequently correcting these errors, and thus of increasing the localization precision. This is usually achieved by conducting a localization method without a certain sensor; this results in a set angle from the location of the impulse source, in particular from the location of the lightning, and from the location of the sensor. This set angle is then compared with the angle actually measured, and an angle correction is derived from the difference. By repeating the method cyclically, an optimization can be achieved. Here, (more precise) T[ime]O[f]A[rrival] location determinations can also be incorporated.

The angle errors to be corrected are caused by errors in the antenna construction and by effects such as reflection or conductivity gradients in the surrounding area. The correction methods compensate the overall error, in particular when a correction function is determined in dependence on the incidence angle, rather than when a singal angle correction is made.

With the T[ime]O[f]A[rrival] method, the two above-mentioned errors are possible accordingly, namely
different runtimes of the signals in the electronic system of the individual sensor locations and/or
environment-related time delays, such as those which may occur due to differences in the conductivity and thus in the signal dispersion speed, or due to reflections and overlays as a result of uneven ground structures.

To date, no correction method for the T[ime]O[f]A[rrival] procedure is known which corresponds to the D[irection]F[inding] correction.

Due to the problem described, the system of the type named in the introduction as well as the method of the type named in the introduction should be further developed in such a manner that errors when determining the respective time progression, in particular the respective arrival time and/or the respective signal run time, for the signals recorded are minimized.

This problem is solved by a system and a method in which at least one of the measuring stations and/or sensor(station)s is adjusted and/or calibrated, whereby this adjustment and/or calibration is conducted as a replacement or as a supplement

- to localize the altitude, in particular the emission altitude or broadcast altitude, of the impulse source, and/or
- to determine the direction, in particular the spatial directional progression, of the impulse emission/broadcast from a natural and/or non-natural origin, in particular of the lightning, of the discharge emission, of the discharge broadcast or of similar.

This calibration correction and/or adjustment method can be used in particular to optimize and/or to correct the T[ime] O[f]A[rrival] technique, since it offers a significant advantage in terms of achieving improved time stamps or time identifications. Using this calibration and/or adjustment method, both 2D location mapping and 3D altitude mapping of lightning discharges can be conducted with a greater degree of precision.

With an advantageous embodiment, initially the position, in particular of the location and/or the altitude, of the impulse source is localized, whereby, excluding the measuring station to be adjusted and/or to be calibrated, each runtime difference between impulses from the same impulse source and each measuring station is determined, in particular from each arrival time which is established.

Furthermore, each time progression, in particular each arrival time, of the signals originating in the localized impulse source and recorded on the measuring station to be adjusted and/or to be calibrated, is calculated.

Based on this, the difference between the calculated respective time progression, in particular the calculated respective arrival time, and the determined respective time progression, in particular the determined respective arrival time, of the signals which originated in the localized impulse source, and recorded on the measuring station to be adjusted and/or calibrated is determined and is prepared in a manner which is statistically meaningful.

If necessary, at least one time correction term is then determined, based on each difference established, in particular for later localizations and/or for later positioning, and the measuring station to be adjusted and/or calibrated is adjusted and/or calibrated using this determined time correction term.

The present adjustment and/or calibration method is based in a manner essential to the invention on the fact that the signal analysis in the central station prepares the recording of the distribution of time deviations between the measured signal arrival time and, based on the completed mapping of the electromagnetic radiation, in particular on the completed lightning mapping, the calculated arrival time, in a meaningful statistical manner, in order to check the correct technical time treatment of the signal runtimes, and if necessary, to re-adjust them, from the form of the determined distribution. After this testing and adjustment method is conducted, an optimum utilization of the runtime differences is guaranteed for the altitude mapping.

The present invention finally relates to the use of at least one system according to the type described above and/or of a method according to the type described above for the localization

- of the altitude of the impulse source, in particular of the emission altitude or of the broadcast altitude, and/or
- of the direction, in particular of the spatial directional path, of the impulse emission or impulse broadcast triggered by the impulse source;

in particular, the present invention can be used with the precise and reliable demarcation of impulse emissions or impulse broadcasts, for example of discharges within a storm cloud (so-called I[ntra]C[loud] lightning) and/or between two storm clouds (so-called C[loud-]C[loud] lightning) against impulse emissions or impulse broadcasts such as discharges between the cloud and the ground (so-called C[loud-]G[round] lightning), which in turn enables the reliable production of impulse density maps compared to the prior art, for example, of lightning density maps.

The system according to the type described above and/or the method according to the type described above can be used for calibrating and/or adjusting at least one measuring or sensor station in networks for lightning localization.

Independently of this, or in connection with this, the present invention, i.e. the system according to the type described above and/or the method according to the type described above can be used in the real time or short-term range

- for the prediction and localization, in particular for the early detection, of climatological and/or meteorological processes such as lightning strikes, (extreme) precipitation, storms, hail, hurricanes, (heavy) rains, turbulence, thunderstorms, wind or from other particular climatological and/or meteorological events,
- for the three-dimensional localization of impulse sources, such as of lightning strokes, including weak signals for the optimization of the prediction and localization, in particular the early detection, of storm cells,
- for the detection of signal sources for prediction and localization, in particular for early detection, of storm cells,
- for the analysis of groups of data and information for the characterization of meteorological classifications,
- for the extrapolation of spatial paths of detected storm sources, and/or
- for obtaining biometeorological information.

BRIEF DESCRIPTION OF THE DRAWINGS

As already discussed above, there are several options of embodying as well as of further designing the teaching of the present invention in an advantageous manner. For this purpose, on the one hand reference is made to the claims dependent on claims 1 and 11, while on the other further embodiments, features and advantages of the present invention will be explained below in more detail with reference to the exemplary embodiment depicted in FIGS. 1 to 8, in which:

In FIGS. 1 to 8, identical reference numerals are assigned to the same or similar embodiments, elements or features.

BEST MODE OF EMBODYING THE INVENTION

Figure 1:
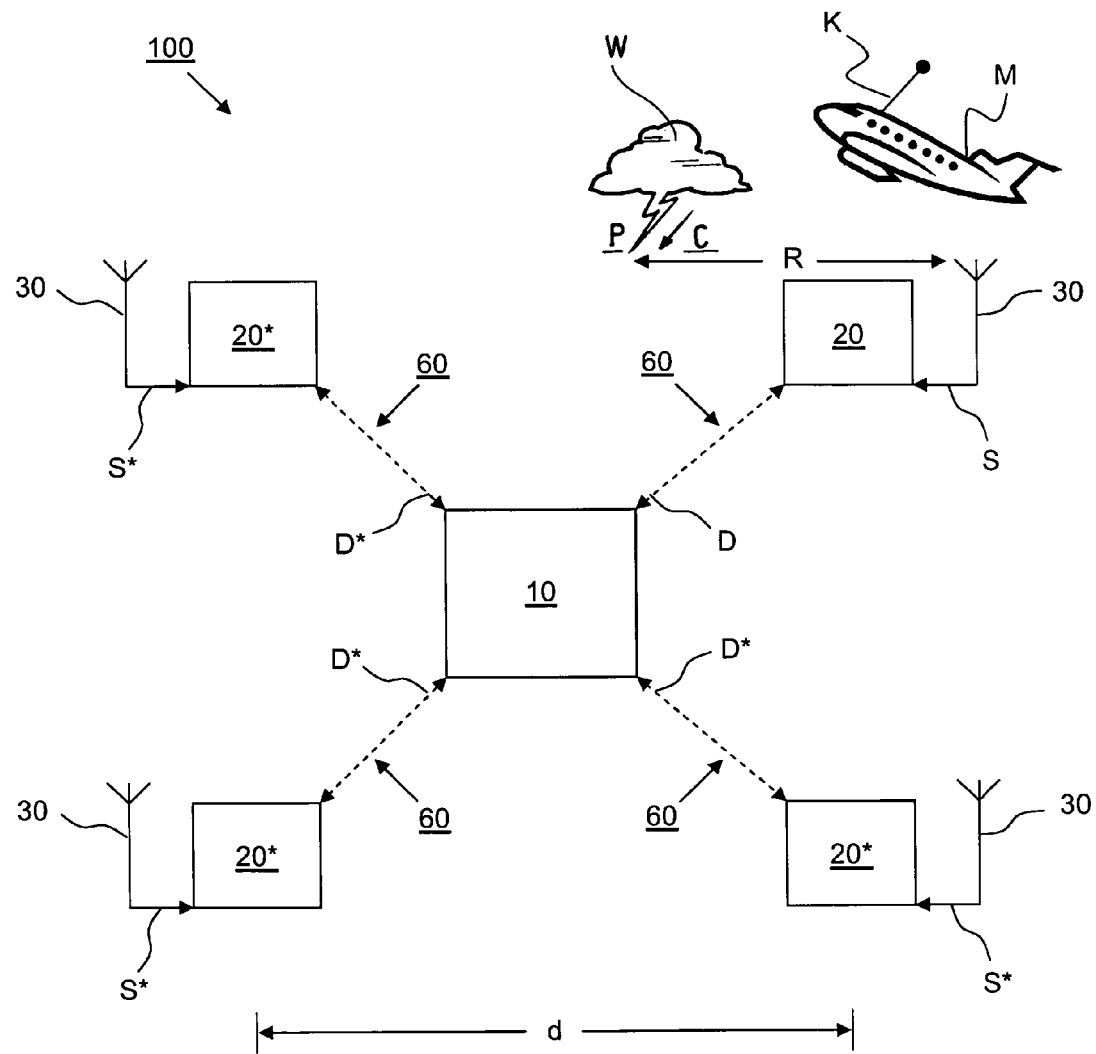
FIG. 1 shows a schematic view of an exemplary embodiment of a system according to the present invention, which operates in accordance with the method according to the present invention.

FIG. 1 shows a system 100 which can be used
both for the characterization of non-natural radiation, such as
of signals transmitted from a transmitter K of an aeroplane M, or
of mobile telephone signals,
and for the characterization of natural radiation, such as of lightning discharges P.

Since the basic method principles for the measurement of impulse emissions or charge broadcasts (charge emissions) of this nature for the electromagnetic radiation originating in impulse sources of a non-natural nature, and for the electromagnetic radiation originating in impulse sources of a natural nature are the same or at least similar, the system 100 will be described in the following using its use in lightning measurement as an example.

The system illustrated in FIGS. 1 to 8, and which is specifically designed as a Sferics/lightning measurement facility (=effectively, a three-dimensional lightning localization network 100), comprises several, namely up to one hundred, individual measuring stations 20, 20* (in FIG. 1, four measuring stations of this type 20, 20* are shown as an example) and a central facility or central station 10.

Figure 2A:
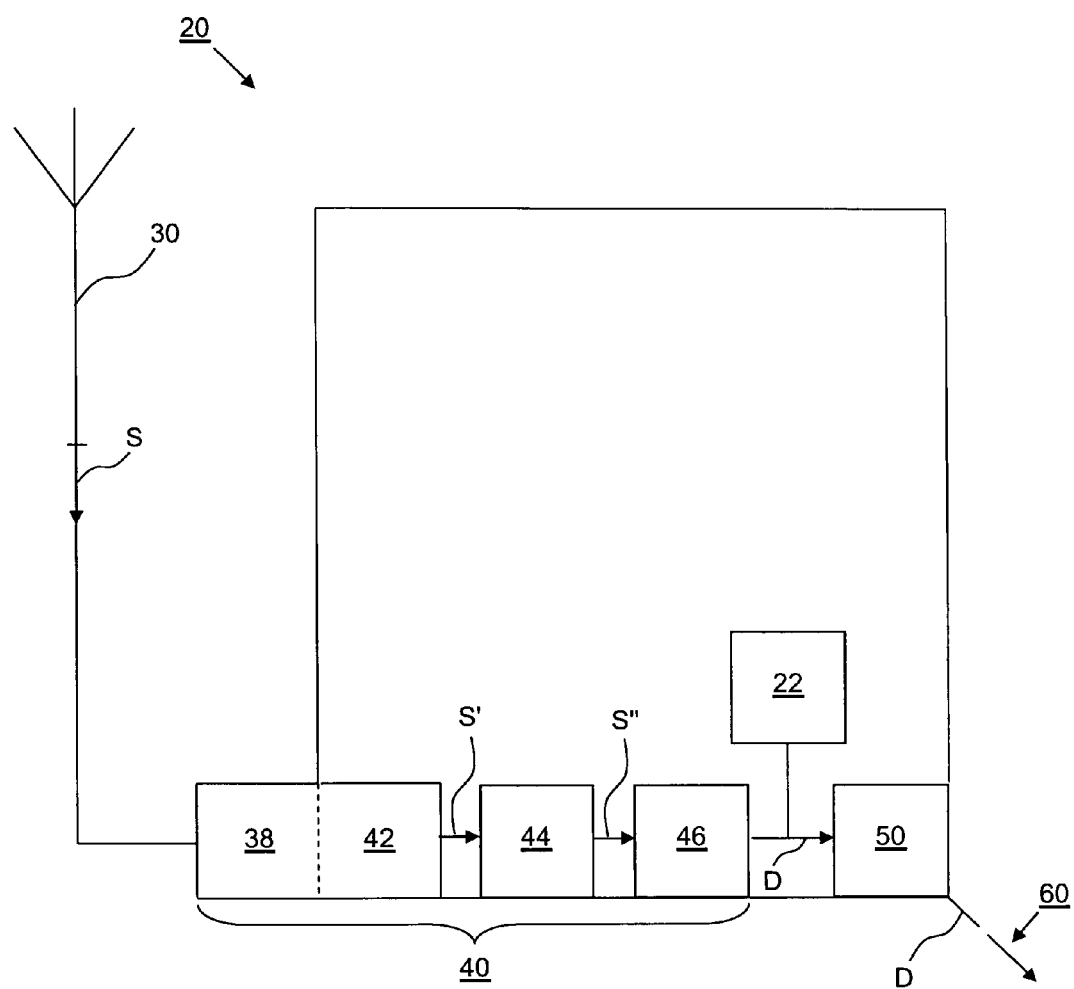
FIG. 2A shows a schematic view of an exemplary embodiment of a measuring station of the system from FIG. 1.

As can be seen from the view in FIGS. 1 and 2A, an antenna or antenna body 30 (cf. FIG. 2B) is assigned to each measuring station 20, 20*, which is designed for the measurement of low-frequency magnetic fields.

Figure 2B:
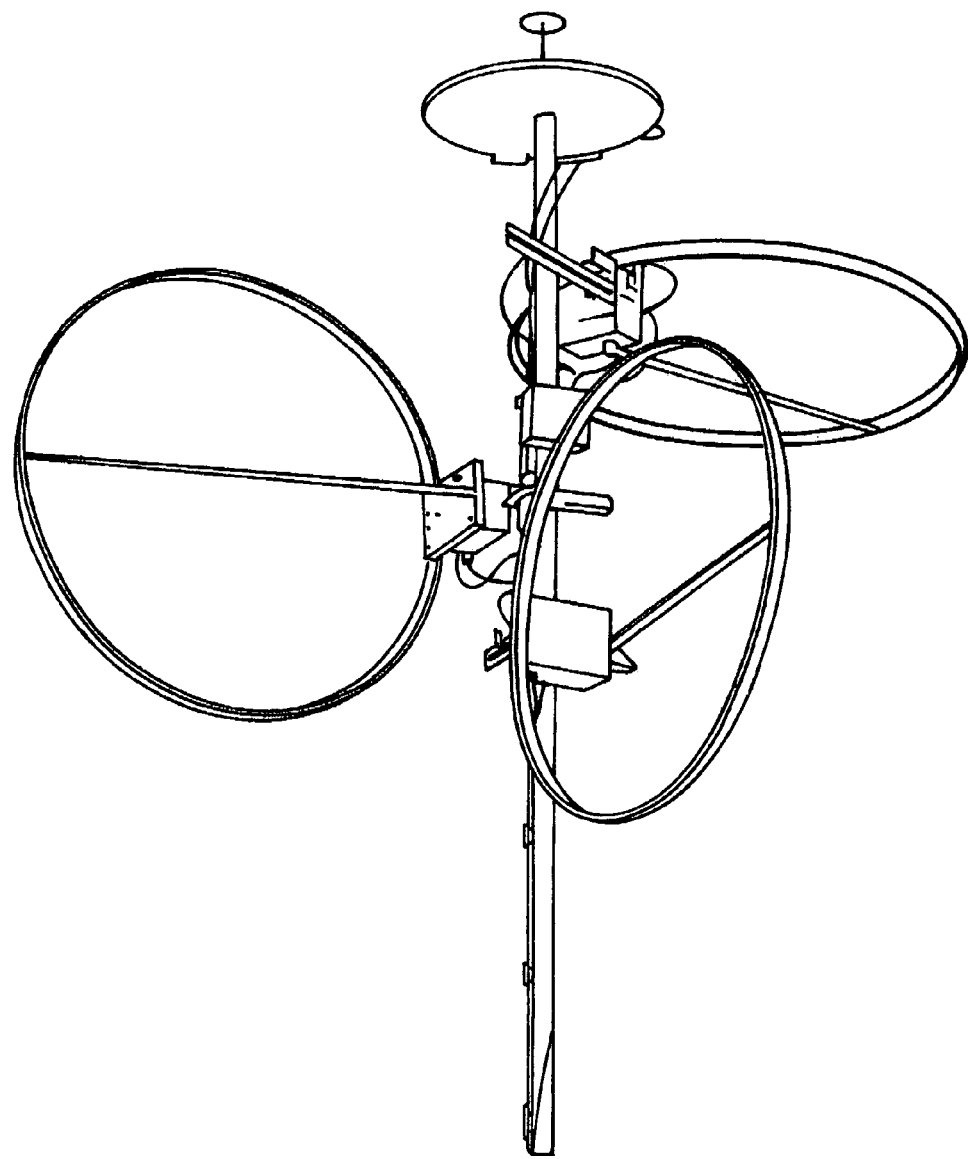
FIG. 2B shows a perspective view of an exemplary embodiment of an antenna unit, which is assigned to the measuring station from FIG. 2A.

Here, it can be seen from FIG. 2B that this antenna body 30 is designed in a mechanically self-supporting form without movable and/or weather-sensitive components, for installation in the open air. The primary circuit of the antenna body 30 is galvanically separated from the secondary circuit; the electromagnetic fields are broad-band and can be decoupled with low noise, and can therefore be measured with time accuracy.

The station electronic system 40 which is arranged in the housing of the measuring stations 20 and 20*, initially comprises an amplifier 42 for the low-noise amplification of the signals S and S* respectively coming from the antenna body 30. Downstream from the amplifier 42 is a filter stage 44. The signal S" which is filtered using the filter unit 44 is thus subjected in the unit 46 to a signal digitalization.

Using the low-noise amplifier 42 and the filter stage 44, a flattening and optimization method can be conducted on the signals S and S*, which in the light of the problem described in the following is of significant advantage.

With signals with a high amplitude and with a simple, undisturbed form, it is relatively simple to determine a characteristic arrival time. Conventional systems according to the prior art relate in their application—in contrast to the present invention—solely on such cases with smooth curve forms, and seek only the maximum for each signal.

The signals S and S*, which reach the respective sensors 20 and 20* in practice are however usually
small,
with their own, often complex and irregular structures, and
overlaid with noise elements.

This makes it more difficult to obtain a clear time identification, in particular, when the signals S and S* are weak and close to the lower detection threshold.

In particular, the search for the (single) absolute signal maximum with different sensors conventionally leads to imprecisions, which regardless of the use of the most accurate time norms, such as the G[lobal]P[ositioning]S[ystem] procedure, usually lie above one microsecond. In cases which are not unusual, the difficulty or imprecision of the standard maximum search finally leads to the overall signal being discarded.

In order to eliminate the problems mentioned above, with the system 100 according to FIG. 1, in connection with FIG. 2A, the signal amplitudes which lie predominantly, but not solely, in the region of a maximum, are subjected to a flattening and optimization method, with which irregularities in the signal run can be compensated.

The corresponding algorithms are essentially based on standard methods, but are however
adapted in the type of application to the specific conditions of the system 100, and
are mathematically optimized to a brief computing time.

This makes it possible to continue to identify with sufficient time accuracy even weak and irregular signals which are affected by noise interference.

Furthermore, with the system 100 according to FIG. 1 in connection with FIG. 2A, not only the highest peak of signals S and S*, are subjected to the flattening and optimization method described above; rather, the entire signal structure which lies above the noise threshold is analyzed in accordance with this flattening and optimization method. In this way, for each individual signal S and S*, in dependence on the total impulse form actually present, a plurality of time or structural information can be provided.

With respect to the station electronic system 40 it should be noted that between the digitalization unit 46 and a memory unit 50 for storing the data and information D and D* respectively processed by the station electronic system 40, a P[ersonal]C[omputer] 22 is connected. In the central evaluation software of the P[ersonal]C[omputer] 22, the structures of the time information which are determined using the flattening and optimization method described are compensated against each other.

In this regard it should be taken into account that conventionally, only one time identification is available for the sensor signal, so that in the prior art, an (unwanted) incorporation of simultaneous interference signals may occur.

In order to avoid this disadvantage, the analysis properties of the central evaluation are designed with reference to the flattening and optimization method in such a manner that the plurality of information items which may be available in the form of time structures are compatible with each other for the individual sensor signals, i.e. within one signal group which belongs to the same lightning stroke, due to the precise time recording and identification.

Due to the preferred use of a plurality of time identifications and/or a plurality of time structures according to the system
- the precision of the signal time identification is increased, and
- the probability of an (unwanted) incorporation of an interference signal, such as a signal with a technical origin with other time structures, is significantly reduced so that the subsequent analysis does not lead to erroneous mapping.

With the memory arrangement 50 as a starting point, finally, a basically bidirectional connection 60 can be used to transmit selected parameters of the signals S and S* respectively to the central station 10.

Figure 3:
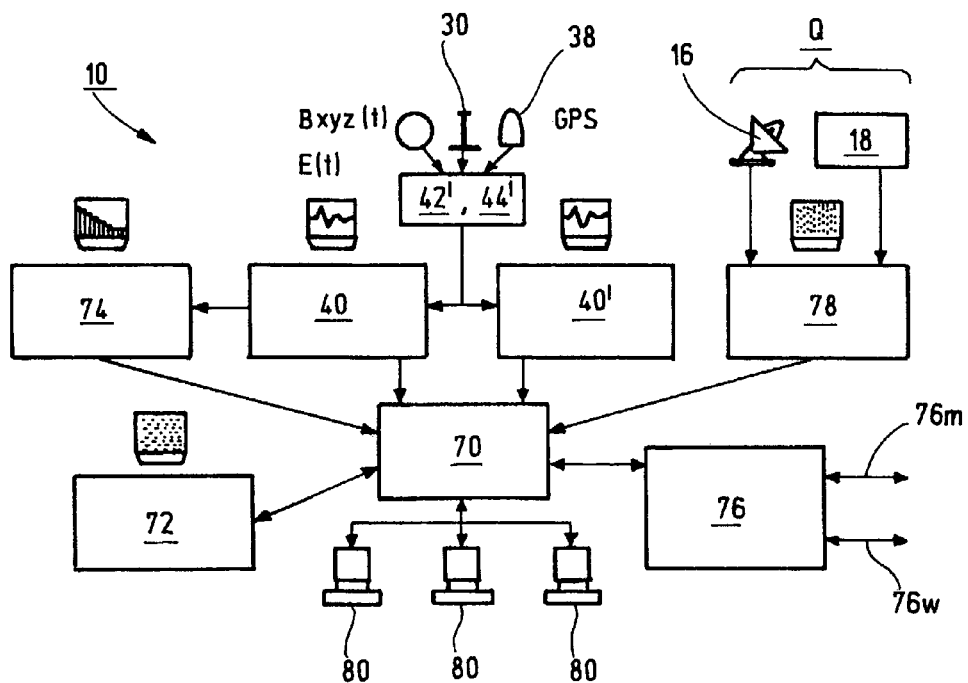
FIG. 3 shows a schematic view of an exemplary embodiment of a central station of the system from FIG. 1.
Figure 4:
FIG. 4 shows a topographical view of an exemplary embodiment of a geographical distribution of the measuring stations and the central station of the system from FIG. 1.

FIG. 3 shows the structure of the central station 10. The Sferics online recording is conducted in different amplitude and time ranges on two separated recording systems 40, 40'. Both recording systems 40, 40' are provided with a high-accuracy G[lobal]P[ositioning]S[ystem] time basis 38 with an accuracy of approximately three hundred nanoseconds. All other individual components of the local station network are provided with the GPS time via a central data server 70.

The first recording system 40 which is designed as the station electronic system (cf. also FIG. 2A) is used to record so-called standard Sferics and is a component not only of the central station 10, but also of all measuring stations 20 and 20*. The recording of the field amplitudes is here respectively conducted for one time interval of 512 microseconds in one amplitude range of the magnetic field strength of up to six nanoteslas.

If the specific trigger condition for a component of the signals S and S*, is fulfilled, the GPS event time is frozen in a hardware register. After the digitalization is ended, the magnetic field vector is calculated from the ratio of the time-dependent magnetic field progressions and its time-dependent amount, i.e. the current Sferics position, is shown on a screen or monitor 72.

With an uncertainty of 180 degrees, the magnetic field vector gives the incidence direction of the signal S and S* respectively. If the time progression of the electrical field amplitude is also available, the incidence direction can be relatively accurately determined. This incidence direction is stored together with the trigger time point and the time progression of the magnetic field amount on the central data server 70. In addition, a F[ast]F[ourier]T[ransformation] 74 of the signals S and S*, is conducted, with an online display.

In order to meet the requirements of lightning research using measuring facilities in the V[ery]L[ow]F[requency] range (so-called applied Sferics research), a second recording system 40' is installed on the central station 10, which records amplitudes in each case
- for a time interval of 512 microseconds, and
- for a time interval of 655 milliseconds in a field strength range of up to sixty nanoteslas.

With this second recording system 40', both the respectively initial events of a possible sequence of partial lightning strokes can be recorded over a time period of 512 microseconds, and the total time structure of partial impulses within a lightning stroke P can be recorded. The recording of the strong signals S and S*, which originate in the close range is therefore conducted simultaneously in two different time windows with a different time resolution.

Alongside the standard time window of 512 microseconds (cf. first recording unit 40), which generally records in a high resolution the signals S and S*, which are generated by the first partial lightning stroke (=so-called "First Return Stroke"), the time progression of the individual strokes is recorded in a 655 millisecondlong time window (time sampling points of sixteen kilobits)

Due to the generally strong signals S and S*, the sensitivity can be reduced, so that with the second recording unit 40', a measuring range of up to approximately sixty nanoteslas results. The trigger time point, the incident direction and both digitalized signal progressions are in turn stored centrally on the server 70.

The second recording system 40' on the central station 10 thus makes it possible to observe events in two different time windows with a different resolution. As a result, both the time progression of the strokes within a lightning event and, with a high resolution, the Sferics caused by individual strokes, can be recorded.

Using the communication unit 76, all the necessary data and information D and D*, from the respective external measuring stations 20 and 20* can be retrieved and stored on the central server 70. For certain standard data, this occurs fully automatically at specified time points; specific data records can be transferred manually.

In addition, using the communication unit 76, data requests can also be met from outside; for this purpose, a f[ile]t[ransfer]p[rotocol] server and a mailbox are provided. All measuring stations 20 and 20* are connected via a modem 76m and a switched line 76w to the central station 10.

In order to be able to study the Sferics data for correlations with meteorological parameters, weather information Q is required. For this purpose, two sources are essentially provided, namely
- a Meteosat receiver 16, which constantly displays and archives the current satellite images, and
- the mailbox 18 of a weather service, which provides access via a switched line to ground weather maps, radar weather maps or similar.

Using a screen or a monitor, satellite images which show ground weather maps, radar weather maps or similar are thus displayed on line (=reference numeral 78 in FIG. 3). As can finally be seen in the view according to FIG. 3, (in FIG. 3, three are given as an example), workstations 80 for analyzing the data on the central server 70 [=File Server, GPS Time Server (Netware Server)] are connected.

The functions of the central station 10 which are essential to the invention are to evaluate the data and information D and D* respectively transmitted from the respective measuring stations 20 and 20*, in particular also in high rates and/or in particular also without a time loss, and to issue graduated and/or fully automated warnings against climatological and/or meteorological processes, in particular against storms.

With the lightning localization system 100 according to the invention, it is possible to design all the essential components in a particularly efficient manner, whereby value is placed on simplicity and cost minimization. The essential features are listed in brief below:

The sensors for the V[ery]L[ow]F[requency] radiation of lightning strokes are two simple coils arranged in a cross, with which as a result of suitable system dimensioning, the magnetic flow B(t) from the two components Bx(t) and By(t) of the lightning field is measured (cf. FIG. 2B).

A sufficiently accurate illustration of the time progression of the impulses which are received is given in the range of between just below ten kilohertz and approximately four hundred kilohertz. From the ratio of the magnetic field components Bx and By, the incident direction of the lightning radiation can be determined. The VLF sensor operates passively and requires no power supply.

For time identification purposes, a standard, separately mounted G[lobal]P[ositioning]S[ystem] receiver is used, with which the signal arrival time can be precisely defined down to approximately one microsecond; this precision is of significance for the correct functioning and for the efficiency of the mappings.

The sensor data runs into a standard P[ersonal]C[omputer] with a specially developed module card for digitalization and pre-processing.

The sensing rate for the signal digitalization is set to one megahertz. Signals which run in are continuously recorded and analyzed in parallel, so that even with extremely high rates, no loss occurs. The maximum processing rate is over one thousand signals per second.

With continuous sensing and using a parallel processing circuit, the sensor 20, 20* measures without down time. As a result, the sensor 20, 20* can process significantly higher data rates than is the case in conventional systems according to the prior art. With conventional systems, after a signal has been detected, no reaction is possible to further signals after a specific (processing) time, as a result of which data loss occurs with high signal rates.

Since the system 100 according to the present invention is able to process significantly higher data rates than the prior art, two subsequent features are possible:

signals can be measured at an earlier point in time, as a result of which reliable early storm warning is possible; and the form of storm cells is significantly more clearly visible, since due to the high sensitivity of approximately one order of magnitude (=of approximatley factor ten), more signals are recorded than in systems according to the prior art. As a result, the cell contours are more clearly visible, and a new type of meteorological utilization of the data is made possible. In particular, this data is suitable due to its large amount for feeding into other meteorological applications, such as for refining and prediction using the M[odel]O[utput]S[tatistics] technology.

For each signal, a compact data package is formed and transmitted via a telephone line to a central unit; due to the D[ial]U[p] N[etworking] bandwidth, only approximately one hundred signals per second can actually be transmitted, which has been shown to be sufficient even with the heaviest storms, however, so that buffer functions are only seldom required.

The total digitalized impulses Bx(t) and By(t) are archived on each station and are retrieved in low-activity time periods, i.e. usually at night, in order to be useful for research and development purposes.

The sensors 20, 20* (cf. FIG. 2A) are mounted for example at six locations in southern Germany (cf. FIG. 4) at an average distance of approximately 115 kilometers, run in continuous mode and transmit data to the central unit (cf. FIG. 3).

The central computer is also a standard P[ersonal]C[omputer], which is equipped with software for data organization and for lightning mapping, and which is designed for continuous operation. Larger networks can also be operated with a suitably equipped P[ersonal]C[omputer] due to the efficiently designed operating modes and software solutions according to the invention, so that for the application of the present invention, no new and/or complex additional measures are required.

Figure 5:
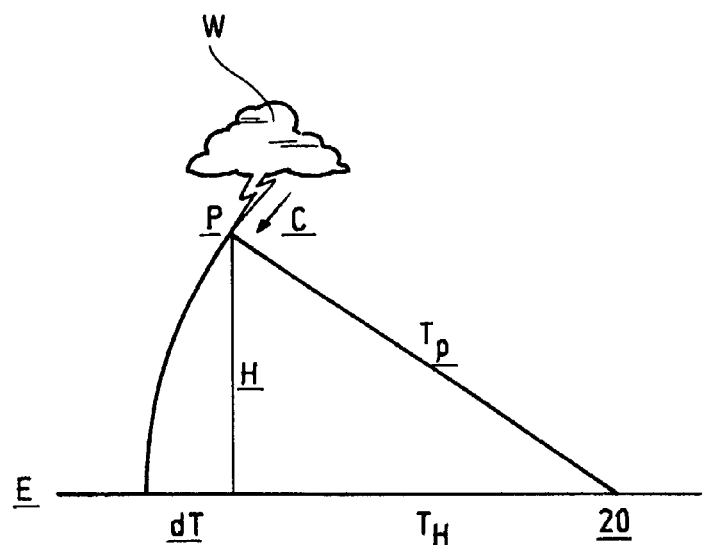
FIG. 5 shows a schematic view of the principle of the method according to the present invention, whereby H is the emission altitude of the V[ery]L[ow]F[requency] lightning radiation.
Figure 6:
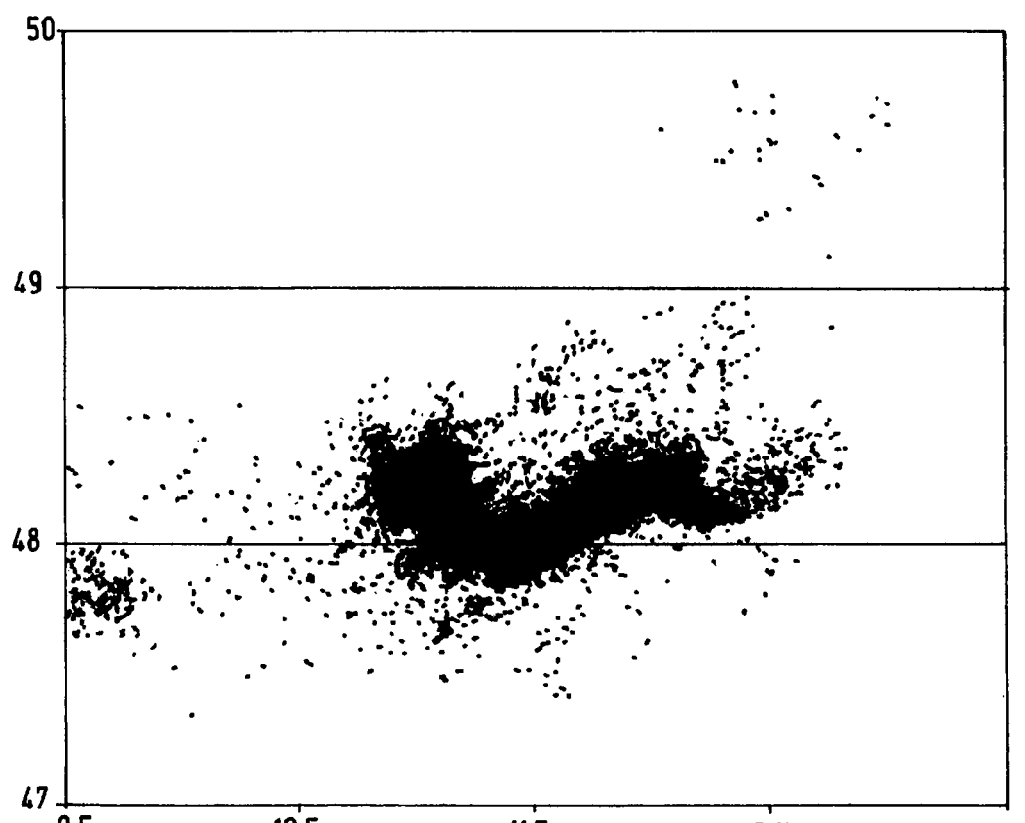
FIG. 6 shows a diagrammatic view of the signals occurring within a longitudinal gradient range plotted on the right axis, and within a latitudinal gradient range plotted on the vertical axis from the atmospheric discharges evaluated using the method according to the present invention.

On the basis of the principle illustrated in FIG. 5 of the present invention, according to which the emission altitude H and/or the directionality C, i.e. the spatial directional path of a lightning discharge P can be localized, when the deviation of the arrival time of the signal S at the measuring station 20 located closest to the lightning discharge P from the arrival time of the corresponding signal S* at for example three of the measuring stations 20* which are not located closest to the lightning discharge P can be determined (cf. FIG. 1), measured lightning strokes are shown as a practical example in the monitoring area with lengths of 9.5 degrees to 13.3 degrees, and with widths of 47 degrees to 49.8 degrees in FIG. 6.

The number of lightning strokes which were recorded on at least three sensors 20, 20* was just over 14,000, including partial lightning strokes. Mappings with just two sensors, 20, 20* are not included, and would further increase the total number of events; in order to avoid erroneous mappings, the incorporation of this data would however require a previous correction of the mapping direction with reference to the so-called "site error", which can only be conducted after an overall evaluation of seasonal data.

Figure 7A:
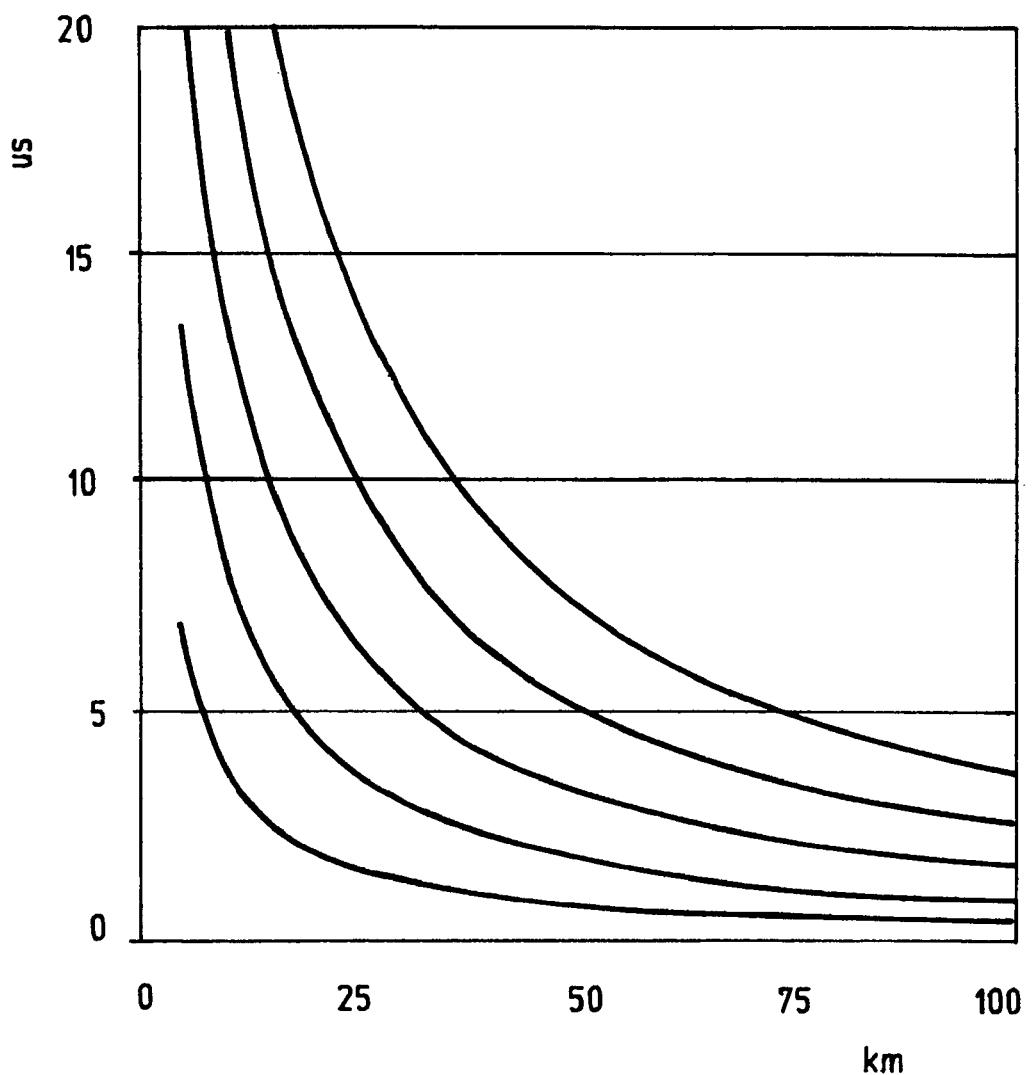
FIG. 7A shows a diagrammatic view of the time delay of the signal arrival times which are determined using the method according to the present invention, which is plotted on the vertical axis, as a function of the observation distance for different emission altitudes which is plotted on the right axis.
Figure 7B:
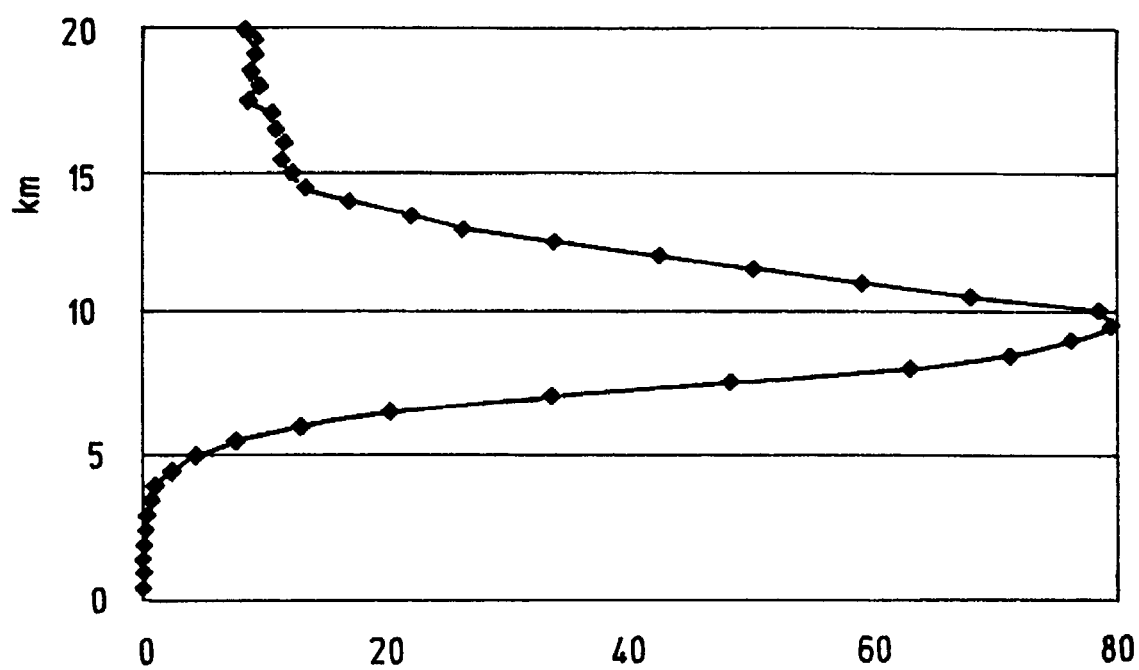
FIG. 7B shows a diagrammatic view of a first example of a discharge altitude distribution which is determined according to the present invention (=the number of discharges recorded on the right axis, plotted against the emission altitude which is recorded on the vertical axis and which is measured in kilometers)
Figure 7C:
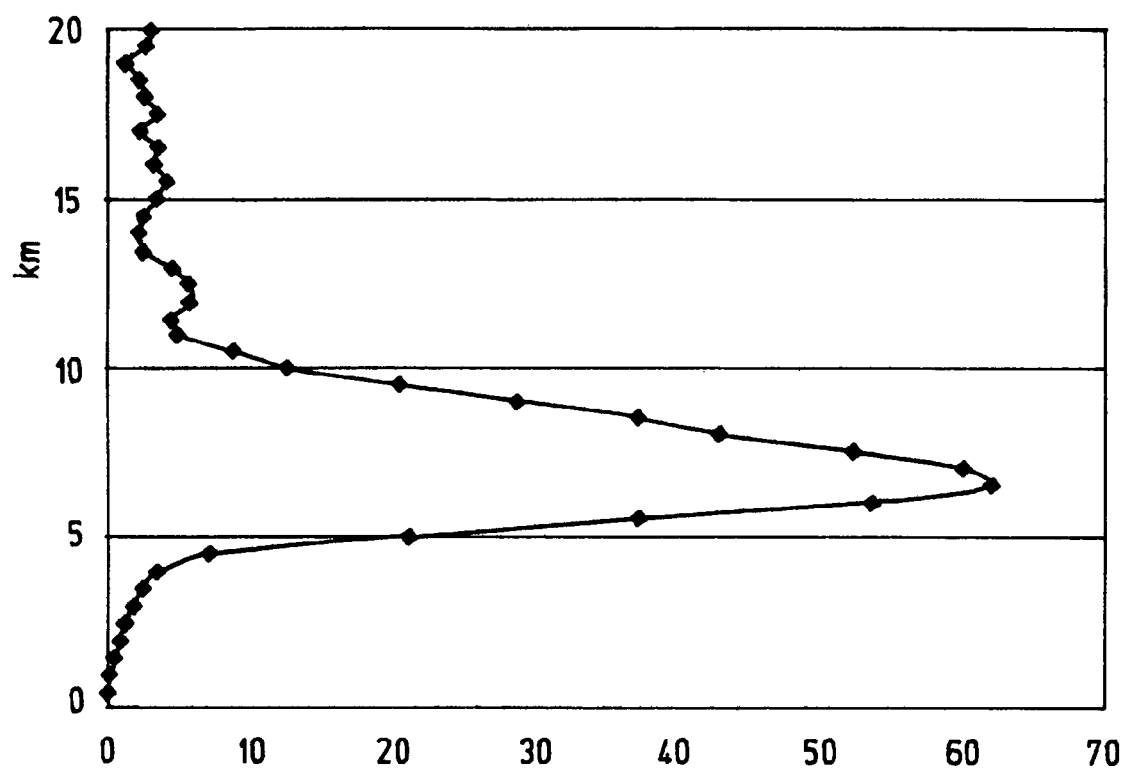
FIG. 7C shows a diagrammatic view of a second example of a discharge altitude distribution determined according to the present invention (=the number of discharges recorded on the right axis, plotted against the emission altitude which is recorded on the vertical axis and which is measured in kilometers)
Figure 7D:
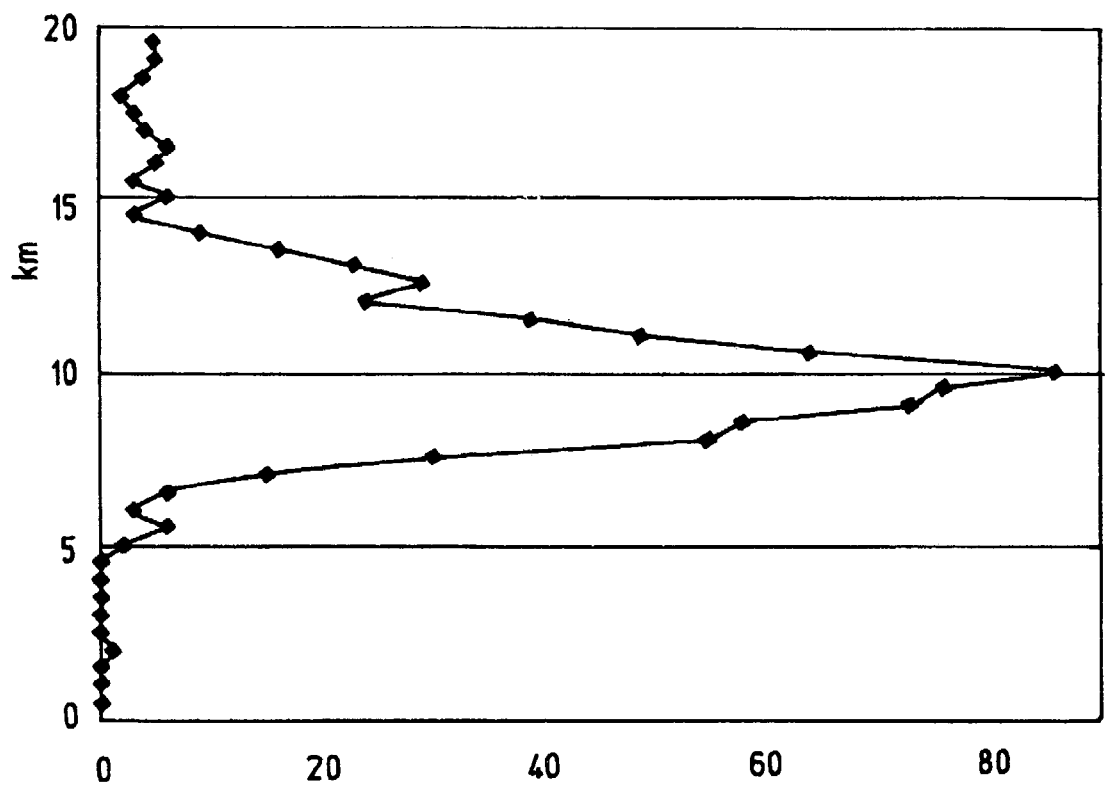
FIG. 7D shows a diagrammatic view of a third example of a discharge altitude distribution determined according to the present invention (=the number of discharges recorded on the right axis, plotted against the emission altitude recorded on the vertical axis and which is measured in kilometers.
Figure 8:
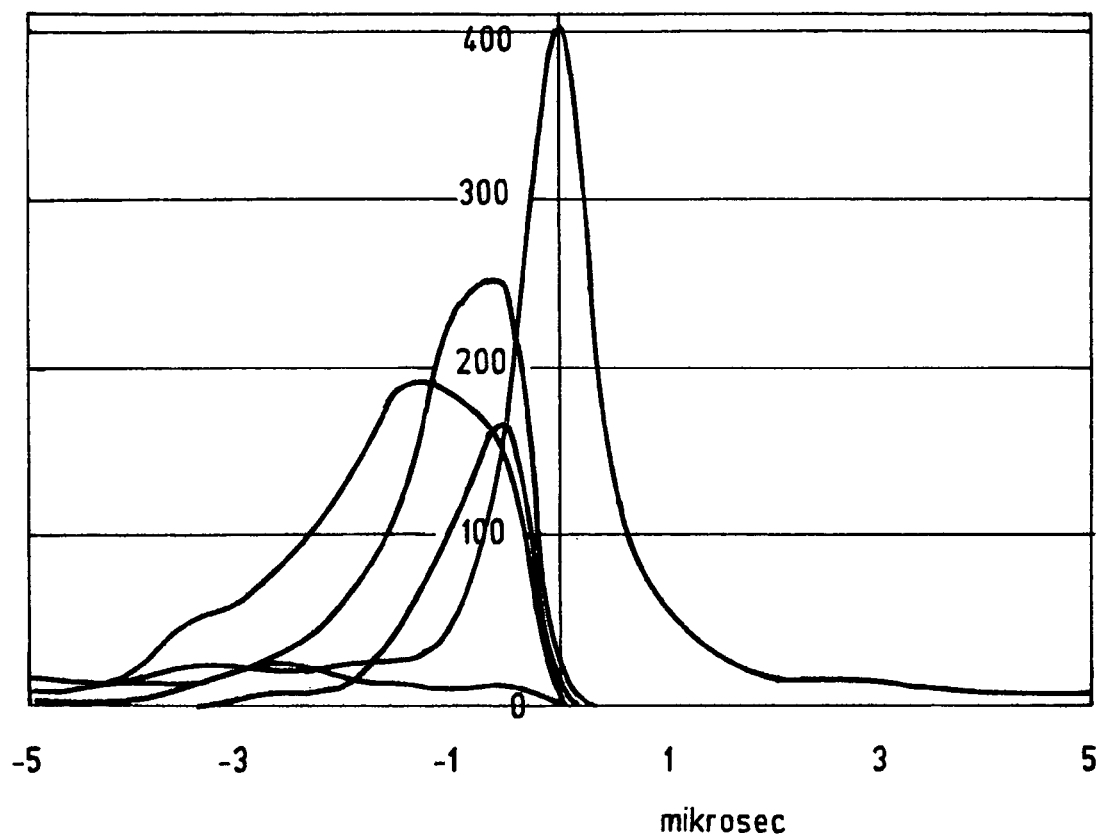
FIG. 8 shows a diagrammatic view of the distribution plotted on the vertical axis (=number) of the time deviations which are determined using the method according to the present invention and which are plotted on the right axis (in us or microseconds) of the arrival signals (negative times signify a time delay).

The data from the network 100 according to the present invention shown in FIGS. 6 to 8 is in itself consistently mapped, and shows a structure which is clearly useful for meteorological purposes. The issue is now raised as to how the division into C[loud]G[round] lightning and I[ntra]C [loud] lightning is to be made.

The literature available on the discrimination of CG and IC lightning is contradictory and will not be discussed in greater detail here. This issue can at any rate still be regarded as being open, whereby greater clarity can be expected from continuing impulse form analyses with an improved time resolution.

As a result, the 2D network according to the method of the present invention will be extended, namely in the form of the utilization of this 2D network as a pseudo 3D network, through which a precise recording of the signal times, in particular of the signal runtimes, on the individual sensor stations 20, 20* is realized.

In this way, the opportunity is provided of conducting three-dimensional mappings for lightning which is sufficiently close to the station. FIG. 7A shows the scheme, while FIGS. 7B, 7C and 7D present the corresponding sensitivity for the altitude mappings:

Thus in FIG. 7A, the anticipated delay in the arrival times of the signals S, S* (in microseconds: us=μsec) is presented as a function of the (observation) distance (in kilometers) for different emission altitudes H, namely for an emission altitude H of five kilometers (=lowest curve), for an emission altitude H of 7.5 kilometers (=second-lowest curve), for an emission altitude H of ten kilometers (=average curve), for an emission altitude H of 12.5 kilometers (=second-highest curve), and for an emission altitude H of fifteen kilometers (=highest curve).

FIG. 7B shows the distribution(=the number plotted on the right axis) of the emission altitudes H, measured in kilometers, and plotted on the vertical axis, of 951 lightning strokes which are mapped in an ambit of up to approximately sixty kilometers around three measuring stations. An emission maximum is shown in an altitude H of just below ten kilometers.

Here, at least three further measuring stations have recorded the lightning strokes. In total, in the same time period, 6,929 lightning strokes were mapped on four or more measuring stations; to these are added approximately 7,800 mappings with three measuring stations, which only permit 3D mappings when mapping directions are additionally used.

In FIGS. 7C and 7D, a corresponding lightning altitude distribution is shown in each case, i.e. a distribution of the emission altitude H of three-dimensionally mapped lightning strokes during a storm at other points in time than those shown in FIG. 7B. An emission maximum results at an altitude H of between six and seven kilometers (cf. FIG. 7C) or at an altitude H of approximately ten kilometers (cf. FIG. 7D).

The data shown contains no ground lightning strokes.

According to the present invention, with an assumed time resolution of the lightning arrival times of approximately one microsecond, an altitude mapping is possible at least in the distance range of up to approximately one hundred kilometers.

The results of the evaluations based on this are shown in FIGS. 7A to 7D as examples. It transpires that the focus of the V[ery]L[ow]F[requency] radiation of discharges in numerous cases is not close to the ground, but at a greater altitude within the storm clouds.

The procedure according to the present invention, together with its result, should now be scrutinized in greater detail, in order to be better able to evaluate its relevance and reliability.

If the method is illustrated using a concrete example which is typical for the altitude mappings presented here, an unusually strong lightning stroke can be used, which is followed 251 milliseconds later by a single, weaker discharge at the same location.

Table 1 lists the key data from the mapping method for this event, namely, the mapping data for the main lightning stroke with the subsequent lightning stroke which occurs 251 milliseconds later:

|  | length | width | type |
|---|---|---|---|
| main stroke |  |  |  |
| 3D mapping | 11.1832 | 47.1962 | CC |
| 2D mapping | 11.1889 | 47.1965 | — |
| subsequent stroke |  |  |  |
| 3D mapping | 11.1846 | 47.1974 | CC |
| 2D mapping | 11.1909 | 47.1979 | — |

The deviations given apply relative to the former mapping; the inner quality of the mapping result achieved with data from six stations according to the present invention is very significnatly improved during the transfer from two-dimensional mapping to three-dimensional mapping.

When the lightning is located without taking the emission altitudes into account, an acceptable localization results in terms of the quality, but the mapping error is higher than would be anticipated as an average.

An inspection of the lightning times recorded on all six stations of the network shows that the arrival time on the relevant station as opposed to the anticipated time from the overall network, and in contrast to the corresponding time errors from the other five stations, is atypically delayed by almost seven microseconds.

If the 3D effect is now switched on according to the invention and a new mapping method is conducted with the lightning altitude as an additional parameter which is to be optimized, a significantly more consistent total result occurs. The newly introduced and optimized emission altitude results in 15.7 kilometers with a statistical error of 3.5 kilometers. If the wholly unrelated subsequent lightning stroke is analyzed in the same way, an almost identical lightning location is obtained with an emission altitude of 16.4±3.5 kilometers.

The procdedure described is applied to all the data treated, and delivers comparable results in each case. In order to make the 3D mapping as reliable as possible, the option is available of only using it in such cases in which discharges are measured on at least four sensor stations.

According to the invention, it is also possible, however, to use weaker signals recorded on only three stations, with the inclusion of the incident directions in the optimization procedure, in order to conduct a 3D mapping with sufficient accuracy.

Table 2 shows the number of three-dimensionally mapped lightning strokes (=detected signals) in the ambit around a measuring station, for example, around the central station 10, and compares these with the total number in the network according to the present invention (R designates the ambit radius, Ns the number of stations respectively used for the two-dimensional mappings; under "H>0", the signals S and S* respectively with high emission altitudes H are listed which are three-dimensionally mapped with at least four measuring stations 20 and 20*; a sample monitoring area is considered with a length of between 9.5 degrees and 13.3 degrees, and with a width of between 47 degrees and 49.8 degrees):

| R (km) | Ns >= 3 | Ns >= 4 | H > 0 |
|---|---|---|---|
| 20 | 365 | 173 | 36 |
| 30 | 1,459 | 718 | 202 |
| 40 | 5,254 | 2,788 | 540 |

-continued

| R (km) | Ns >= 3 | Ns >= 4 | H > 0 |
|---|---|---|---|
| 50 | 9,088 | 4,851 | 679 |
| 60 | 13,508 | 7,098 | 711 |
| total area | 60,327 | 36,909 | 2,114 |

A result can be derived insofar as only a prominent share of the higher emission locations can be assigned to the signals registered in the network according to the present invention.

According to the invention, with the present system 100 and with the method used as the basis for this system 100, a delimitation or separation of cloud lightning strokes (=discharge P within a cloud W and/or between at least two clouds W) as opposed to earth lightning strokes (=discharges P between the cloud W and the earth E) can be conducted.

Thus in FIG. 8, the symmetrical curve around the zero time point (=no time deviation) is identifiable as an earth lightning or ground lightning curve, i.e. the symmetrical curve in FIG. 8 shows the 4,450 non-mappable ground lightning strokes (C[loud]G [round] *0.26).

The additional four curves shown in FIG. 8 originate from the cloud lightning strokes, whereby the negative times signify a time delay; these are plotted for four different distance ranges between the lightning and sensor stations, namely:

for the distance range up to twenty kilometers (=cloud lightning curve with the lowest peak in FIG. 8), for the distance range between twenty and forty kilometers (=cloud lightning curve with the third lowest peak in FIG. 8), for the distance range between forty and sixty kilometers (=cloud lightning curve with the fourth lowest peak in FIG. 8), and for the distance range over sixty kilometers (=cloud lightning curve with the second lowest peak in FIG. 8).

Overall, in FIG. 8, a distribution of 2,247 calculated time deviations of the station respectively closest to the lightning, with a total of 6,697 mapped lightning strokes, is shown.

All in all, the present invention relates to a system and to a method for detecting lightning which comprises not only an increased efficiency level, but also offers the opportunity essential to the invention of conducting a three-dimensional differentiation between discharges within a cloud and cloud-ground discharges:

During the past twenty years, systems for localizing lightning have been developed for commercial purposes, chiefly in the USA, but also in France and in Japan; this development culminated in the establishment of the NALDN (N[orth]A[merican]L[ightning]D[etection]N[etwork]) in 1989. Since then, different upgrades have been made, and the technology has been introduced in a large number of countries.

According to the prior art generally used, and which has been discussed in the introduction efficiencies with regard to lightning detection are reported which total approximately ninety percent, the localization accuracy levels achieved are better than one kilometer, and the IC-CG differentiation using wave form criteria is designated as being almost perfect.

Ground lightning densities are calculated as operational results, and are intended to provide important data for lightning protection technologies.

For more modern networks, the opportunity of precisely locating the lightning is conventionally verified using measurements, which include lightning strokes in radio towers, however, the detection efficiency and the method for differentiating between IC discharges versus CG discharges remains highly questionable; initially, networks were developed which were only intended to show CG discharges which could potentially cause damage on the ground, while IC discharges were suppressed using procedures which were not published in detail.

Although the increase time and the peak zero transit time of the detected VLF pulses can apparently be used, the relevant differentiation parameters were repeatedly subjected to alterations in the past. In recent years, it has finally be acknowledged that IC discharges are of relevance, at least meteorologically, and modern networks thus also show the detected IC lightning events.

Accordingly, according to the invention, a three-dimensional option is introduced for determining emission altitudes and for an online differentiation between C[loud]G[round] or G[round]C[loud] discharges as opposed to or compared to I[ntra]C[loud] or C[loud]C[loud] discharges:

The new lightning localization network according to the present invention, which can be transferred to continuous operation, and which covers for example an area in southeastern Germany of between almost 300 kilometers and 400 kilometers. enables the lightning activity recorded to be analyzed, in particular with reference to the occurrence of heavy storms, and a comparison to be drawn with data from established lightning localization networks.

The most noteworthy results can be summarized as follows:

Compared to conventional networks according to the prior art, the network according to the present invention indicates more discharges by up to one order of magnitude; the majority of the additional signals comprise a lower ampitude.

For the differentiation of discharges within a cloud (I[ntra]C[loud]) as against cloud-ground discharges (C[loud]G[round]), a new, three-dimensional technique is applied; this means, among other things, that the conventional differentiation between IC and CG discharges using wave form criteria should be modified in the light of the findings of the present invention, not least because the majority of localized events were ground lightning strokes.

Compared to the prior art, the ground lightning densities should also be subjected to a review, with a tendency towards greater numbers.

The network according to the present invention comprises for example six sensor stations, and is arranged in such a manner that it measures as much V[ery]L[ow]F[requency] activity arising from developing storms as possible; highly efficient, modern data processing is implemented in the present invention, in order to maximize the meteorologically relevant output, and in order to determine possible opportunities for better data and information with regard to early warning purposes.

As a result, the present invention can be used to collect lightning discharges in far greater quantities than anticipated. A comparison with the data from conventional networks shows an excess of factor three to ten, so that far better detection of storm cells and storm contours is possible. These results lead to the issue of where the additional strikes originate, and give cause for a more detailed study of the method for IC-CG differentiations.

Since the procedure for analyzing wave form criteria known from the prior art is highly complex, according to the invention, the immediate method for 3D localization is applied which requires neither assumptions of any kind, nor parameters to be adapted of any kind.

In a manner which is surprising to persons skilled in the art, it transpires that this technology according to the invention, which has to date been used in no other network, is very successful, and enables the identification of IC lightning in almost 85 percent of all cases. The principle of this procedure is explained in the following:

When a sensor which is located sufficiently close to a discharge records an IC event in contrast to a horizontal dispersion in the case of a CG storm strike), this sensor receives the VLF signal with a time delay $dT=T_P-T_H$ (cf. FIG. 5). An emission altitude of ten kilometers causes for example a delay of approximately three microseconds with a sensor distance of fifty kilometers.

Since the precision of GPS-based measurements of the arrival times is usually of an order of magnitude of one microsecond or better, a 3D differentiation of IC lightning strokes is possible as long as the average distance between the network sensors and the discharge event is not too great.

The applicability of the 3D procedure to a given network can be determined using a study of the distribution of the time delay P(dT), which is obtained by the sensor in question, which is located closest to the localized lightning. In this connection, the localization implies that the discharge must be detected at a sufficient number of sensor stations.

In the absence of IC discharges, P(dT) is a highly symmetrical distribution, while the existence of detectable IC discharges causes a displacement of the P(dT) distribution at negative times (in correspondence with a time delay) (cf. FIG. 8).

In the light of the latter situation, the emission altitude H can be introduced as an additional parameter in the localization algorithm. The experimental distributions p(dT) according to the present invention are actually asymmetical and give typical results. The derived emission altitudes of several kilometers appear to be appropriate, but cannot result from CG discharges, and thus probably represent IC discharges.

In a further development essential to the invention, network simulations are used in order to make the result according to the present invention more robust:

Thus, calculated arrival times are statistically deformed until the accuracy of the entire localization for the network matches the actual results, and therefore lies between a half kilometer in the centre and one kilometer close to the network border.

If no IC discharges are assumed, the synthetic time displacements result in approximately fifteen percent "incorrect" IC identifications, while on the assumption of one hundred percent IC discharges with the assumed height distribution, 85 percent are recorded.

A study of the actual data examples according to the present invention makes clear that less than thirty percent of the events can be assigned to IC discharges. As a consequence, it must be argued that the majority of the additionally recorded events are CG discharges.

Different consequences of the result according to the present invention require further comment:

A new technology for IC-CG differentiations, which in principle can be used by any modern localization network, and which offers new input in relation to cloud physics research, is provided.

The results according to the present invention can be used in order to check the already known wave form criteria mentioned above, and to improve them; it is to be expected that a combination of the two methods will result in a highly reliable IC-CG differentiation.

The occurrence of a large number of additional results requires an update of the detection efficiency levels of networks.

The increase in CG discharges which can be obtained according to the invention requires an update of the maps of ground lightning densities.

The results of the present invention can be used to check the wave form criteria for a far greater data basis than before; according to the invention, an optimization of the detection efficiency, a comparison with VHF data from other, highly-specialized 3D research systems and a study of the processes in relation to IC discharges is also guaranteed.

Finally, the application of the signal analysis according to the invention permits the utilization of weak and irregularly formed lightning impulses, and enables in all such cases sufficiently precise time recording. It has been shown that this leads to a significant improvement in the detection efficiency of the lightning measuring network, and alongside reliable two-dimension location mapping, also to clear altitude mapping of lightning emissions in the VLF range.

In addition to this two-dimensional location mapping and/or to this three-dimensional location mapping or directionality mapping, according to the present invention, at least one of the measuring stations 20 and 20\* can also be adjusted or calibrated, which leads to improved time recording.

A calibration (corrective) method of this nature advantageously comprises the following steps:

a) the two-dimensional lightning localization is conducted without the involvement of the station 20 and 20\* respectively to be calibrated;

b) the runtime from the lightning location to the respective station 20, 20\* is determined;

c) the signal arrival time thus determined is compared with the arrival time actually measured;

d) statistics are produced regarding the time differences determined in step c);

e) with correct calibration, the difference should comprise an average value of zero, and should fluctuate around the zero point;

f) it has been shown in general that said difference shows a trend either towards positive values or towards negative values; this difference is the time correction term;

g) however, it should be ensured and taken into account through suitable measures, that a signal delay is not caused by cloud-cloud lightning strokes (cf. below) or is recognized as such;

h) with the following localizations, the averaged difference from step f) should be applied as a time correction;

i) this said correction can also be determined in relation to the direction to the lightning location as a correction function, in order to incorporate non-isotropic ambient effects, where necessary.

As a result of the calibration correction or (post-) adjustment the two-dimension location mapping is improved, and/or when sensor station(s) which are close to the lightning are included, the three-dimensional altitude mapping with regard to the cloud-earth lightning discrimination becomes more reliable, since even smaller time delays are to be evaluated as significant; the altitude mapping is quantitively improved, since the altitudes determined also automatically become more precise due to the more precise time differences.

LIST OF REFERENCE NUMERALS 100 system
10 central station or central unit
16, 18 interface of the central station 10, in particular of the
16 meteosat receiver
18 mailbox of a weather service
20 measuring station or sensor (station) spatially located closest to an impulse source
20* measuring station or sensor (station) spatially not located closest to an impulse source
22 data processing system, in particular P[ersonal]C[omputer]
30 antenna, in particular broadband antenna body
38 time measurement facility, in particular G[lobal]P[ositioning]S[ystem] clock
40 station electronic system of the central station 10 and the measuring stations 20, 20*, in particular first Sferics online recording system for the central station 10
40' second station electronic system of the central station 10 in particular second Sferics online recording system for the central station 10
42 amplification unit of the station electronic system 40
42' amplification unit of the central station 10
44 filter unit of the station electronic system 40
44' filter unit of the central station 10
46 A[nalog]/D[igital] converter unit of the-.station electronic system 40
50 memory unit of the measuring station 20, 20*
60 connection between the central station 10 and the measuring station 20, 20*
70 server unit of the central station 10, in particular central data server and/or time server
72 display unit assigned to the server unit 70, such as screen or monitor, in particular for displaying the current Sferics position
74 F[ourier]T[ransformation] of the signal S, S* with online display
76 communication center of the central station 10
76m modem of the communication center 76
76w switched line of the communication center 76
78 online display of satellite images, of ground weather maps, of radar weather maps and of similar using at least one display unit, in particular using at least one screen or monitor
80 workstation for analyzing data and information D, D*
A amplitude of the signal S, S*
C directionality, in particular spatial direction path, of the impulse emission or impulse broadcast
d distance between the measuring stations 20, 20*
dT runtime delay, whereby $dT=T_P-T_H$
D data and information coming from the measuring station or sensor (station) 20 spatially located closest to the impulse source
D* data and information coming from the measuring station or sensor (station) 20* spatially not located closest to the impulse source
E earth, in particular ground
H altitude of the impulse source, in particular emission altitude or broadcast altitude
K transmitter
M aeroplane
P atmospheric discharge, in particular lightning
Q further climatological and/or meteorological data and information source
R distance between the impulse source and the measuring stations 20, 20*
S signal assigned to the measuring station or sensor (station) 20 which is spatially located closest to the impulse source
S* signal assigned to the measuring station or sensor (station) 20* which is spatially not located closest to the impulse source
S' signal amplified using the amplification unit 42
S" signal filtered using the fiter unit 44
TH impulse emission time or impulse broadcast time adjusted by the effect of the altitude H, in particular discharge time adjusted by the effect of the altitude H
TP impulse emission time or impulse broadcast time, in particular discharge time
W cloud

The invention claimed is:

1. A system for recording, transmitting and analyzing data and information generated by electromagnetic radiation that originates from at least one impulse source, comprising a plurality of spatially separated measuring stations, each comprising at least one antenna body for recording signals attributed to electromagnetic radiation and a time measurement device for determining the arrival time and time progression of said recorded signals, wherein the altitude of said impulse source and/or the directionality of the impulse emission caused by said impulse source may be localized based on the deviation between the arrival time of the signal at the measuring station located closest to said impulse source and the arrival time of the signal at each of the remainder of said plurality of measuring stations which are not located closest to said impulse source, and wherein said directionality is determined to be essentially vertical when the amplitude of the received signal at each of said plurality of measuring stations varies in inverse proportion to the distance between each respective measuring station and said impulse source and wherein said directionality is determined to be essentially horizontal when the amplitude of the received signal at each of said plurality of measuring stations deviates from said inverse proportionality and said deviation can be corrected based on the altitude angle, and the angle between the impulse emission axis and the direction to the respective measuring station.

2. The system according to claim 1, wherein a plurality of received signals which originate from impulse sources in a spatially limited and/or time limited range can be combined, and that the deviation of the amplitude of an individual received signal can be correlated with the group assigned to the signal.

3. The system of claim 1 wherein with an impulse emission from altitudes in the kilometer range, using comparisons of distributions of time deviations measured on at least one measuring station located closest to said impulse source, and on at least two measuring stations which are not located closest to said impulse source, at least two discharge times are detectable.

4. The system of claim 1, wherein the altitude of the impulse source and/or the directionality of the impulse emission is determinable using a first measuring station that is located closest to the impulse source, and a second measuring station which is not located closest to the impulse source, when the incident direction of the impulse emission is determinable.

5. The system of claim 1, wherein each of said plurality of measuring stations comprise at least one station electronic system arranged separately from the antenna body for processing the recorded signals into digital data, wherein the station electronic system comprises at least one amplification unit for the low-noise amplification of the signals recorded using said antenna body; at least one filter unit for filtering said amplified signals and at least one Analog/Digital converter unit for converting the filtered signals and at least one self-regulating threshold for optimizing the sensitivity of said station electronic system.

6. The system of claim 1 wherein said recorded signal is provided with at least one time identification, and is analyzed such that a plurality of time and/or structural samples is created.

7. The system of claim 1, wherein said antenna body is designed for installation in the open air in a mechanically self-supporting form, without movable and/or weather-sensitive components, that the primary circuit of said antenna body is galvanically separated from the secondary circuit of said antenna body, and that the electromagnetic fields are broadband and can be decoupled with low noise, and can therefore be measured with time accuracy.

8. The system of claim 1 wherein said measuring stations are arranged at a distance of approximately one hundred kilometers from each other, and each is in communication with a central station, to which at least a portion of said digital data can be transmitted.

9. The system of claim 1, further comprising at least one interface for incorporating at least one additional climatological and/or meteorological data and information source for characterizing the overall weather situation.

10. The system of claim 1, wherein said electromagnetic radiation comprises low frequency radiation.

11. A method for recording, transmitting and analyzing data and information generated by electromagnetic radiation, where said electromagnetic radiation originates from at least one impulse source, comprising:
   a. recording, using a plurality of spatially separated measuring stations, signals attributed to said electromagnetic radiation using an antenna body which is assigned to the respective measuring station;
   b. determining the respective time progression and arrival time of the recorded signals using at least one time measurement device, which is assigned to the respective measuring station, and
   c. localizing the altitude of the impulse source, and/or the directional information of the impulse emission created by the impulse source by determining the difference between the arrival time of the signal at the measuring station located closest to the impulse source and the arrival time of the signal at each of the remainder of said plurality of measuring stations which are not located closest to said impulse source, whereby the directional information of the impulse emission is identified as being essentially vertical, when the amplitude of the received signal at each of said plurality of measuring stations varies in inverse proportion to the distance between each respective measuring station and said impulse source, and is identified as being essentially horizontal, when the amplitude of the signal deviates from inverse proportionality, wherein this deviation can be corrected based on the altitude angle, and the angle between the discharge axis, and the direction to the respective measuring station.

12. The method of claim 11, whereby the impulse emissions within a cloud and/or between at least two clouds can be differentiated from impulse emissions between the cloud and the earth.

13. The method of claim 11, further comprising providing a station electronic system, whereby using said station electronic system, the electromagnetic radiation which typically occurs in individual waves is analyzed in relation to its spectral properties using Fast Fourier Transformation, said respective time progression of the signals is recorded in full with variable pulse forms, all signals are recorded continuously, and signal-specific parameters for classifying and assigning the signals to specific atmospheric processes are determined.

14. The method of claim 11, whereby the signals which arrive at each of said measuring stations are provided with at least one precise time identification, further comprising determining the deviation between the arrival time of the signal at the measuring station located closest to the impulse source and the arrival time of the signal at each of the remainder of said plurality of the measuring stations not located closest to the impulse source using said time identification.

15. The method of claim 11, further comprising calibrating at least one measuring station.

16. The method of claim 15, further comprising:
   a. Localizing the position of the impulse source such that the respective difference of runtime of impulses from said impulse source to each measuring station is determined from the calculated respective time progression,
   b. Calculating the respective arrival time of the signals originating from the localized impulse source and recorded on the measuring station to be calibrated;
   c. Determining the difference between said calculated respective arrival time, and said determined respective arrival time, of the signals originating from the localized impulse source and recorded on the measuring station to be calibrated in a statistically meaningful manner, and
   d. Determining, if necessary due to the determined respective difference, at least one time correction term, and
   e. Adjusting the measuring station to be calibrated using this determined time correction term.

17. The method of claim 11, wherein said electromagnetic radiation comprises low frequency radiation.

* * * * *